(12) United States Patent
Matsuyama

(10) Patent No.: US 6,383,576 B1
(45) Date of Patent: May 7, 2002

(54) METHOD OF PRODUCING A MICROCRYSTAL SEMICONDUCTOR THIN FILM

(75) Inventor: Jinsho Matsuyama, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/545,578

(22) Filed: Apr. 7, 2000

Related U.S. Application Data

(62) Division of application No. 09/123,329, filed on Jul. 28, 1998, now Pat. No. 6,166,319.

(30) Foreign Application Priority Data

Aug. 1, 1997 (JP) .............................. 9-208131

(51) Int. Cl.[7] ..................... H01L 31/0264; C23C 16/22; C23C 16/24; C23C 16/44; C23C 16/509
(52) U.S. Cl. ................. 427/585; 136/258; 136/249; 136/261; 427/578; 427/569; 427/74; 438/96; 438/97; 438/488
(58) Field of Search ............. 136/258, 249, 136/261; 427/585, 578, 569, 74; 438/96, 97, 488

(56) References Cited

U.S. PATENT DOCUMENTS

| | | | |
|---|---|---|---|
| 4,109,271 A | 8/1978 | Pankove | 357/30 |
| 4,816,082 A | 3/1989 | Guha et al. | 136/249 |
| 5,021,103 A | 6/1991 | Hamakawa et al. | 148/33 |
| 5,324,364 A | 6/1994 | Matsuda et al. | 136/249 |
| 5,456,762 A | 10/1995 | Kariya et al. | 136/258 |
| 5,573,601 A * | 11/1996 | Saitoh et al. | 136/258 |
| 5,677,236 A * | 10/1997 | Saitoh et al. | 437/109 |
| 5,716,480 A * | 2/1998 | Matsuyama et al. | 136/249 |
| 5,720,826 A * | 2/1998 | Hayashi et al. | 136/249 |
| 5,730,808 A | 3/1998 | Yang et al. | 136/249 |
| 5,769,963 A | 6/1998 | Fujioka et al. | 136/258 |
| 5,834,796 A * | 11/1998 | Matsuda et al. | 257/57 |
| 5,913,986 A * | 6/1999 | Matsuyama | 136/255 |
| 6,057,005 A * | 5/2000 | Nishimoto | 427/578 |
| 6,166,319 A * | 12/2000 | Matsuyama | 136/249 |
| 6,177,711 B1 * | 1/2001 | Kariya | 257/458 |

FOREIGN PATENT DOCUMENTS

| | | |
|---|---|---|
| EP | 0 609 104 | 8/1994 |
| EP | 0 661 761 | 7/1995 |

OTHER PUBLICATIONS

J. Meier, et al., "On the Way Towards High Efficiency Thin Film Silicon Solar Cells by the 'Micromorph' Concept", Mat. Res. Soc. Symp. Proc., vol. 420, pp. 3–13 (1996).

(List continued on next page.)

*Primary Examiner*—Alan Diamond
(74) *Attorney, Agent, or Firm*—Fitzpatrick, Cella, Harper & Scinto

(57) ABSTRACT

A photovoltaic element of the present invention is a photovoltaic element having a plurality of pin junctions each formed of a p-type semiconductor layer, an i-type semiconductor layer, and an n-type semiconductor layer each comprising a non-single-crystal material comprising a Group IVA element as a principal component, the photovoltaic element having a first pin junction comprising microcrystal silicon carbide (hereinafter referred to as microcrystal SiC) as a principal component of the i-type semiconductor layer and a second pin junction comprising microcrystal silicon (hereinafter referred to as microcrystal Si) as a principal component of the i-type semiconductor layer, wherein the first pin junction is provided closer to the light incidence side than the second pin junction. Provided thereby are a low cost photovoltaic element which exhibits little photodeterioration and high photoelectric conversion efficiency, and a production method of the photovoltaic element capable of forming i-type microcrystal silicon and microcrystal SiC at a practical deposition rate.

1 Claim, 7 Drawing Sheets

OTHER PUBLICATIONS

K. Miyachi, et al., "Fabrication of a–Si Solar Cells with High Collection Efficiency", Ext. Abs. Jap. Soc. Appl. Phys., No. 2, $53^{rd}$ Autumn Mtg., p. 746, 17p–B–5 (1992).

Y. Hattori, et al., "High Efficiency Amorphous Heterojunction Solar Cell Employing ECR–CVD Produced p–Type Microcrystalline Film", Tech. Dig. Int'l. PVSEC–3, Tokyo, Japan, A–lla–3 (1987).

J. Meier, et al., "Intrinsic Microcrystalline Silicon ($\mu$c–Si:H)—A Promising New Thin Film Solar Cell Material", IEEE $1^{st}$ World Conf. On Photovoltaic Ener. Conv., Waikoloa, Hawaii, pp. 409–412 (1994).

S. Guha, "Amorphous Silicon Alloy Solar Cells and Modules—Opportunities and Challenges", $25^{th}$ Photovoltaic Spec. Conf., Washington, DC, pp. 1017–1022 (1996).

D. Fischer, et al., "The 'Micromorph' Solar Cell: Extending A–Si:H Technology Towards Thin Film Crystalline Silicon", $25^{th}$ Photovoltaic Spec. Conf., Washington DC, pp. 1053–1056 (1996).

\* cited by examiner

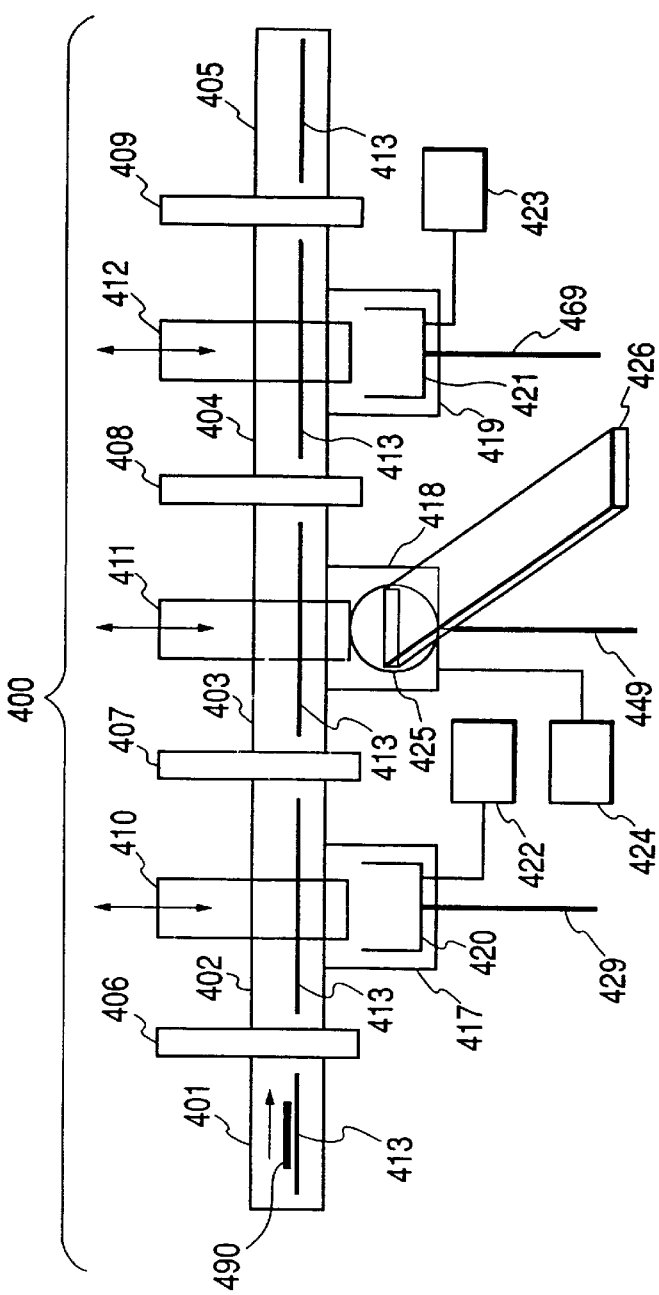
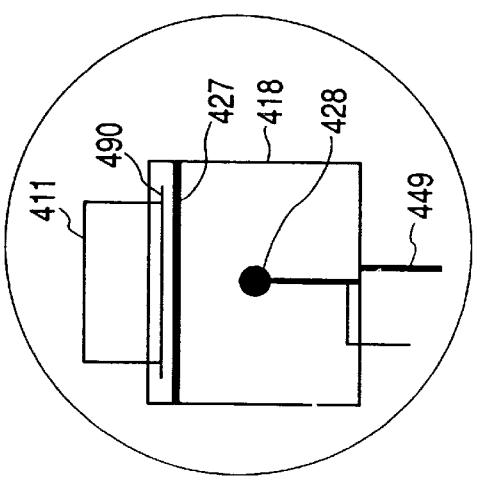
FIG. 4A
FIG. 4B

METHOD OF PRODUCING A MICROCRYSTAL SEMICONDUCTOR THIN FILM

This application is a divisional of Ser. No. 09/123,329 filed Jul. 28, 1998, now U.S. Pat. No. 6,166,319.

BACKGROUND OF THE INVENTION

1. Field of the Invention

The present invention relates to a photovoltaic element and a method of producing the same. More particularly, the invention concerns a photovoltaic element that can be produced at a low manufacturing cost and that demonstrates a high photoelectric conversion efficiency and little photodeterioration, and a method of producing the same.

2. Related Background Art

Significant technological issues include reducing manufacturing cost and increasing photovoltaic element area. Low cost materials having high conversion efficiency have been investigated in this regard.

As such materials for the photovoltaic elements, there can be included, for example, Group IVA amorphous semiconductors of the tetrahedral type such as amorphous silicon (hereinafter referred to as amorphous Si or a-Si), amorphous silicon germanium (hereinafter referred to as amorphous SiGe or a-SiGe), amorphous silicon carbide (hereinafter referred to as amorphous SiC or a-SiC), etc., Group II-VI compound semiconductors such as CdS, $Cu_2S$, etc., Group I-III-$VI_2$ compound semiconductors such as $CuInSe_2$, CuInGaSe, etc. , and so on.

Among others, thin-film photovoltaic elements using an amorphous semiconductor for a photovoltaic energy generation layer have advantages in that a film thereof can be formed in a larger area, in a smaller thickness, and on an arbitrary substrate material, as compared with the single-crystal photovoltaic elements, and are thus promising for practical application.

However, increased photoelectric conversion efficiency and improved photodeterioration must be pursued in the practical application of the aforementioned photovoltaic elements using the amorphous semiconductor as elements to generate electric power.

With respect to the increased photoelectric conversion efficiency, there are the following reports.

(a) A single cell (of a type having only one pin junction) was obtained which exhibited a photoelectric conversion efficiency over 13% (Miyachi et al., Extended Abstracts (The 53rd Autumn Meeting, 1992); The Japan Society of Applied Physics, 17p-B-5, p. 746).

(b) One way to increase the photoelectric conversion efficiency is to improve the so-called doped layers such as the p-type semiconductor layer, the n-type semiconductor layer, etc. The doped layers are required to have small activation energy and little absorption of light. U.S. Pat. No. 4,109,271 discloses the technology in which amorphous silicon carbide (a-SiC) is used to expand the optical band gap of the doped layers, thus reducing the absorption of light.

(c) It has been reported that microcrystal SiC is used for the doped layer to decrease the activation energy and the absorption of light (Y. Hattori et al., 3rd International Photovoltaic Science and Engineering Conference, 1987, p. 171).

(d) U.S. Pat. No. 4,816,082 discloses the technology in which a gradient in the layer thickness direction is given for the band gap of the i-type semiconductor layer.

On the other hand, as methods for improving the photodeterioration, the following can be included.

(e) A method of reducing the localized states of the amorphous semiconductor layer.

(f) A method of using an alloy of a Group IVA element for the amorphous semiconductor layer and adjusting its compositional ratio to a suitable value.

(g) A method of forming a stacked photovoltaic element, thereby decreasing the absorption of light per unit cell and decreasing the thickness of the i-type semiconductor layers.

As a consequence, there has recently been reported (S. Guha, 25th IEEE Photovoltaic Specialists Conference, 1996, p. 1017) that a triple stacked photovoltaic element was obtained which had a pin junction of a-Si film, a pin junction of a-SIGe film, and a pin junction of a-SiGe film stacked in order from the light incidence side and demonstrated a 10.4% photodeterioration rate and an 11.83% stabilization efficiency. However, there are desires for further reduction in photodeterioration rate and further improvement in stabilization efficiency.

In contrast, there has recently been reported a photovoltaic element which uses microcrystal silicon for the i-type semiconductor layer and exhibits little photodeterioration (J. Meier et al., IEEE First World Conference on Photovoltaic Energy Conversion, 1994, p. 409). This photovoltaic element was fabricated using plasma CVD by glow discharge, similar to the fabrication process of the conventional amorphous type photovoltaic elements. There is thus a possibility that a large-area photovoltaic element can be fabricated by an inexpensive fabrication process, as with the conventional amorphous type photovoltaic elements. However, the photoelectric conversion efficiency of this photovoltaic element is only 7.7% even in a recent report (D. Fischer et al., 25th IEEE Photovoltaic Specialists Conference, 1996, p. 1053), which is still inferior to those of the conventional amorphous silicon single cells (~13%). Therefore, the photovoltaic elements using microcrystal silicon for the i-type semiconductor layer have been an important technological subject in the pursuit of improvement in photoelectric conversion efficiency.

In addition, the photovoltaic elements using the microcrystal silicon for the i-type semiconductor layer have essential problems in that the band gap of microcrystal silicon is narrow and the open circuit voltage (Voc) of the photovoltaic element is as low as about 0.4–0.5 V.

As a method of solving these problems, there has been studied a method of stacking a photovoltaic element using microcrystal silicon for the i-type semiconductor layer and a photovoltaic element using amorphous silicon for the i-type semiconductor layer to form a stacked photovoltaic element, instead of using as a single cell the photovoltaic element using microcrystal silicon for the i-type semiconductor layer. In this way the open circuit voltage (Voc) of the photovoltaic element is increased and the photoelectric conversion efficiency is improved. As a result, there has recently been achieved the photoelectric conversion efficiency of 13.1% in the above-mentioned stacked photovoltaic element (D. Fischer et al., 25th IEEE Photovoltaic Specialists Conference, 1996, p. 1053). However, it was also reported in the reference that stacking of the photovoltaic element using amorphous silicon for the i-type semiconductor layer naturally resulted in photodeterioration and that after photodeterioration for 145 hours, the photoelectric conversion efficiency was 10% and the photodeterioration rate was 12%.

This value, a photodeterioration rate of 12%, cannot be said to be small, when compared with that of the photovoltaic element using only the amorphous semiconductor (for example, the one demonstrating the photodeterioration rate of 10.4% and the stabilization efficiency of 11.83% as described previously). Further, the element described in Fischer is also inferior in stabilization efficiency. It is believed that this result is due to the fact that in order to match the electric current generated in the microcrystal silicon with the electric current generated in the amorphous silicon, the film thickness of amorphous silicon with a large band gap but with a small absorption coefficient must be large, approximately 210 nm, whereby the photodeterioration of the amorphous silicon portion increases.

Heretofore, as a method for the production of microcrystal silicon, there has been employed, for example, a high frequency plasma CVD process using a frequency in the range of 13.56 MHz to 110 MHz (J. Meier et al., IEEE First World Conference on Photovoltaic Energy Conversion, 1994, p. 409), but this production method showed a very small deposition rate of microcrystals, approximately 0.1 nm/sec and was difficult to be practically applied to the fabrication of photovoltaic elements.

Further, as the production method of doped microcrystal SiC, there has been reported, for example, the ECR plasma CVD process employing the frequency of 2.45 GHz with application of a magnetic field (Y. Hattori et al., 3rd International Photovoltaic Science and Engineering Conference, 1987, p. 171), but this method had a problem that the underlying semiconductor layer was damaged. Therefore, i-type microcrystal SiC has never been made by this method.

SUMMARY OF THE INVENTION

A first object of the present invention is to solve the aforementioned problems, thus providing a photovoltaic element that can be produced at a low cost suitable for practical use, that demonstrates little photodeterioration, and that also has a high photoelectric conversion efficiency.

A second object of the present invention is to provide a method of producing the photovoltaic element, capable of forming i-type microcrystal silicon and microcrystal SiC at a practical deposition rate.

The present inventor foresaw the above-stated problems and has studied new element structures and production methods for obtaining a photovoltaic element with a large open circuit voltage (Voc) and with a high photoelectric conversion efficiency. The inventor has consequently accomplished the objects of the present invention by the photovoltaic element having the following structure.

Specifically, the photovoltaic element of the present invention is a photovoltaic element having a plurality of pin junctions each formed of a p-type semiconductor layer, an i-type semiconductor layer, and an n-type semiconductor layer each comprising a non-single-crystal material comprising a Group IVA element as a principal component, the photovoltaic element having a first pin junction comprising microcrystal silicon carbide (hereinafter referred to as microcrystal SiC) as a principal component of the i-type semiconductor layer and a second pin junction comprising microcrystal silicon (hereinafter referred to as microcrystal Si) as a principal component of the i-type semiconductor layer, wherein the first pin junction is provided closer to the light incidence side than the second pin junction.

The method of producing the photovoltaic element according to the present invention is a method of producing a photovoltaic element having a microcrystal semiconductor thin film, wherein forming the microcrystal semiconductor thin film comprises setting the pressure of a film forming gas introduced into a film forming space to 50 mTorr or less; using a high frequency having a frequency of not less than 0.1 GHz to generate a plasma in the film forming space, thereby decomposing the film forming gas; applying a self-bias of not more than −50 V to a high frequency electrode provided in the film forming space while applying a DC voltage to a substrate on which the microcrystal semiconductor thin film is to be deposited and/or to the high frequency electrode; and controlling an amount of incidence of positive ions generated by decomposition of the film forming gas to the substrate.

BRIEF DESCRIPTION OF THE DRAWINGS

FIG. 4A is a schematic view to show an example of an apparatus for forming the semiconductor layers of the photovoltaic element according to the present invention, and FIG. 4B is a schematic enlarged view of the inside of the deposition chamber;

DESCRIPTION OF THE PREFERRED EMBODIMENTS

Figure 1:
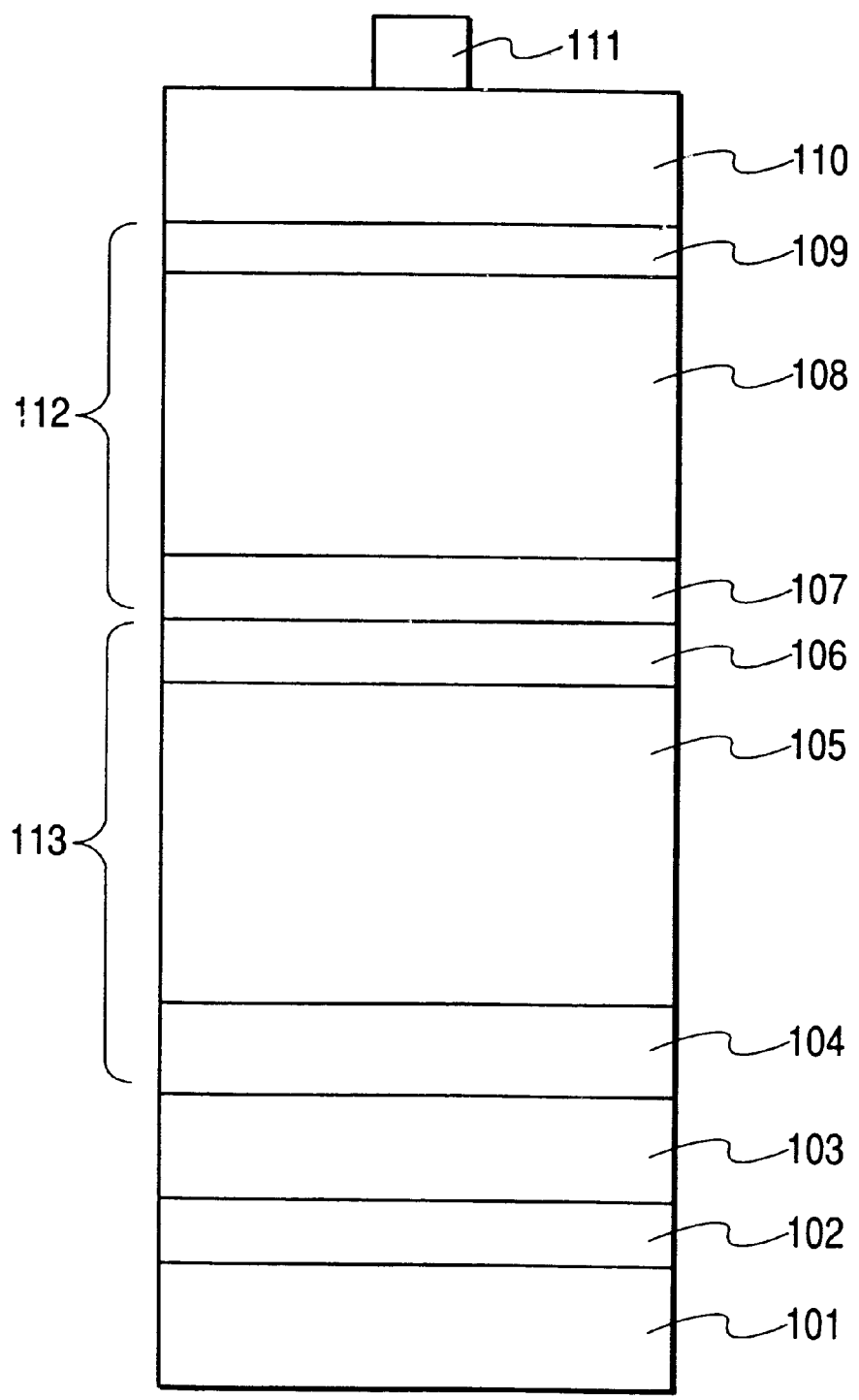
FIG. 1 is a schematic, cross-sectional view to show an example of the photovoltaic element according to the present invention.

The operational effects of the present invention will be described below.

When the photovoltaic element is constructed in such structure that the first pin junction comprising microcrystal silicon carbide as a principal component of the i-type semiconductor layer is located closer to the light incidence side than the second pin junction comprising microcrystal silicon as a principal component of the i-type semiconductor layer, the following operational effects are achieved.

(1) The open circuit voltage (Voc) of the whole photovoltaic element is increased, the absorption of light per pin junction is decreased, the fill factor (FF) is improved, and the photoelectric conversion efficiency of the photovoltaic element is increased.

(2) When compared with the stacked photovoltaic element having a plurality of microcrystal silicon cells stacked, the photovoltaic element of the present invention comprises microcrystal SiC as a principal component of the i-type semiconductor layer, whereby the band gap of the i-type semiconductor layer is expanded and whereby the built-in potential of the pin junction is increased. Therefore, the open circuit voltage (Voc) of the photovoltaic element is increased and short-wavelength light is utilized effectively, thereby increasing the photoelectric conversion efficiency of the photovoltaic element.

(3) When compared with the stacked photovoltaic element having stacked a pin junction using an i-type semiconductor layer of amorphous silicon on the light incidence side of a microcrystal silicon cell, the photovoltaic element of the present invention comprises microcrystal SiC as a principal component of the i-type semiconductor layer, whereby the photo-deterioration rate of the photovoltaic element can be reduced and whereby the stabilization efficiency after photo-deterioration is thus improved. This is conceivably because inclusion of microcrystal SiC as a principal component of the i-type semiconductor layer expands the band gap of the i-type semiconductor layer and suppresses generation of photo-induced defects due to the Staebler-Wronski effect.

(4) Decrease in peeling off of the photovoltaic element and decrease in defects in the semiconductor layers increase the yield in production of photovoltaic elements and durability of photovoltaic elements. The detailed mechanism of this action is still indefinite, but a conceivable reason is as follows. Since there is a great difference in stress of a deposited film between microcrystal silicon and amorphous silicon, this difference in stress tends to create such defects as cracks in amorphous silicon in the case of the photovoltaic element of the structure where amorphous silicon is deposited on a microcrystal silicon cell. However, in the photovoltaic element of the present invention, the inclusion of microcrystal SiC as a principal component of the i-type semiconductor layer makes smaller the difference in stress thereof from the microcrystal silicon cell, thus decreasing such defects as cracks in the i-type semiconductor layer. In addition, it is believed that in the photovoltaic element according to the present invention, the inclusion of microcrystal SiC as a principal component of the i-type semiconductor layer suppresses diffusion of a valence electron controller or metal atoms or the like in the i-type semiconductor layer.

When the aforementioned i-type semiconductor layer comprising microcrystal SiC includes microcrystal Si as another principal component of the i-type semiconductor layer in addition to microcrystal SiC, the photodeterioration rate of the photovoltaic element can be further decreased. As a consequence, the stabilization efficiency after photodeterioration is further increased and the yield in production of photovoltaic elements and the durability thereof are further improved.

When the photovoltaic element has a third pin junction comprising microcrystal silicon germanium (hereinafter referred to as microcrystal SiGe) as a principal component of the i-type semiconductor layer and when the first pin junction and the third pin junction are disposed with the second pin junction therebetween, the third pin junction can absorb light that the microcrystal silicon cell forming the second pin junction failed to absorb, so that the third pin junction can generate the photovoltaic energy. Therefore, the open circuit voltage (Voc) of the entire photovoltaic element is further enhanced, and thus the photoelectric conversion efficiency is further increased.

When the photovoltaic element has a pn junction formed of a p-type semiconductor layer of a compound semiconductor and an n-type semiconductor layer of a compound semiconductor and when the first pin junction and the pn junction are disposed with the second pin junction therebetween, the pn junction can absorb light that the microcrystal silicon cell forming the second pin junction failed to absorb, so that the pn junction can generate the photovoltaic energy. Therefore, the open circuit voltage (Voc) of the entire photovoltaic element is further enhanced, and thus the photoelectric conversion efficiency is further increased.

When the compositional ratio of carbon in the aforementioned i-type semiconductor layer comprising microcrystal SiC varies in the film thickness direction and when the minimum of the compositional ratio of carbon exists within the half of the thickness of the i-type semiconductor layer on the p-type semiconductor layer side, generation of photocarriers is made larger on the p-type semiconductor layer side and the transit distance of holes with small mobility becomes smaller. The slope of the band gap also promotes transition of photocarriers in the i-type semiconductor layer on the n-type semiconductor layer side, so as to increase the collection efficiency of photocarriers. Therefore, the open circuit voltage (Voc) and the fill factor (FF) of the photovoltaic element are enhanced, and thus the photoelectric conversion efficiency is further increased.

When the average grain diameter and/or the volume percentage of the microcrystal semiconductor which forms the i-type semiconductor layer is varied with the change in the compositional ratio of carbon in the i-type semiconductor layer comprising microcrystal SiC, the following operational effects are achieved.

(1) When the average grain diameter and/or the volume percentage of the microcrystal semiconductor in the film increases with decrease in the compositional ratio of carbon in the i-type semiconductor layer comprising microcrystal SiC, the slope of the band gap becomes larger to promote transit of photocarriers and to increase light absorption. Therefore, the short circuit current (Jsc) and fill factor (FF) of the photovoltaic element are enhanced, thus increasing the photoelectric conversion efficiency. This change is suitable for the i-type semiconductor layer ranging from near the n-type semiconductor layer to the vicinity of the center of the film thickness of the i-type semiconductor layer.

(2) When the average grain diameter and/or the volume percentage of the microcrystal semiconductor in the film increases with an increase in the compositional ratio of carbon in the i-type semiconductor layer comprising microcrystal SiC, decrease in the light absorption and in the mobility of photocarriers due to the increase in the compositional ratio of carbon can be compensated for by an increase in the average grain diameter and/or the volume percentage of microcrystals. This results in enhancing the short circuit current (Jsc) and fill factor (FF) of the photovoltaic element and the open circuit voltage is increased due to an increase of the band gap and decrease of reverse diffusion of electrons to the p-layer, thereby increasing the photoelectric conversion efficiency. This change is suitable for the i-type semiconductor layer near the p-type semiconductor layer.

When the average grain diameter of the microcrystal semiconductor in the i-type semiconductor layer comprising microcrystal SiC is not less than 3 nm and not more than 50 nm, the photoelectric conversion efficiency of the photovoltaic element is increased much more and the photodeterioration rate is decreased. In addition, the yield in production is improved and photovoltaic element durability is also improved. It is considered that when the average grain diameter of microcrystals is less than 3 nm, the amorphous property appears stronger than the microcrystalline property, so as to increase the photo-deterioration rate, and that when the average grain diameter of microcrystals is more than 50 nm, the light absorption of silicon becomes dominated by indirect transition, whereby the light absorption decreases to decrease the short circuit current (Jsc) of the photovoltaic element.

When the volume percentage of the microcrystal semiconductor in the i-type semiconductor layer comprising the microcrystal SiC is not less than 30%, the microcrystalline property appears stronger than the amorphous property, so as to decrease the photo-deterioration rate. As a result, the photoelectric conversion efficiency of the photovoltaic element is increased much more.

When the average grain diameter and/or the volume percentage of the microcrystal semiconductor forming the i-type semiconductor layer varies with change in the compositional ratio of germanium in the i-type semiconductor layer comprising microcrystal SiGe, the following operational effects are achieved.

(1) When the average grain diameter and/or the volume percentage of the microcrystal semiconductor in the film increases with increase in the composition rate of germanium in the i-type semiconductor layer comprising microcrystal silicon germanium, the slope of the band gap becomes larger, so as to promote transition of photocarriers and increase light absorption. This results in enhancing the short circuit current (Jsc) and the fill factor (FF) of the photovoltaic element, thereby increasing the photoelectric conversion efficiency. This change is suitable for the i-type semiconductor layer ranging from near the n-type semiconductor layer to the vicinity of the center of the thickness of the i-type semiconductor layer.

(2) When the average grain diameter and/or the volume percentage of the microcrystal semiconductor in the film increases with decrease in the compositional ratio of germanium in the i-type semiconductor layer comprising microcrystal silicon germanium, decrease in the light absorption due to the decrease in the compositional ratio of germanium can be compensated for by an increase in the average grain diameter and/or the volume percentage of microcrystals, the short circuit current (Jsc) of the photovoltaic element is enhanced, and the open circuit voltage and the fill factor are improved by increase of the band gap and decrease of reverse diffusion of electrons to the p-layer, thus increasing the photoelectric conversion efficiency. This change is suitable for the i-type semiconductor layer near the p-type semiconductor layer.

In the method of producing the photovoltaic element having the microcrystal semiconductor film, when forming the microcrystal semiconductor thin film comprises setting the pressure of a film forming gas introduced into a film forming space to 50 mTorr or less; using a high frequency having a frequency of not less than 0.1 GHz to generate a plasma in the film forming space, thereby decomposing the film forming gas; and applying a self-bias of not more than −50 V to a high frequency electrode provided in the film forming space while applying a DC voltage to a substrate on which the microcrystal semiconductor thin film is to be deposited and/or to the high frequency electrode, thereby controlling an incident amount of positive ions generated by decomposition of the film forming gas to the substrate, the following operational effects are achieved.

(1) By using a high frequency having a frequency of not less than 0.1 GHz to generate a plasma, thus decomposing the film forming gas, it is possible to increase the electron density of the plasma, so that active species (ions, radicals, etc.) can be generated in an amount sufficient to achieve a practical deposition rate for production of photovoltaic elements.

(2) By setting the pressure of a film forming gas to 50 mTorr or less, it is possible to prevent the thus generated active species from reacting in the vapor phase to undergo polymerization.

(3) By provision of the high frequency electrode to which the self-bias of not more than −50 V is applied, it is possible to prevent the generated positive ions from excessively entering the substrate surface on which the deposited film is formed, so that the excessive ions are prevented from damaging the deposited film, thereby promoting growth of microcrystals.

(4) By applying the DC voltage to the substrate and/or to the high frequency electrode to control the incident amount of the positive ions generated by decomposition of the film forming gas to the substrate, it is possible to promote the growth of microcrystals while maintaining the practical deposition rate.

The synthetic action of the above effects (1) to (4) enables the microcrystal semiconductor thin film to be formed with high quality and at a practical deposition rate.

Embodiments of the present invention will be described below.

Structures of Photovoltaic Elements

Structures of photovoltaic elements and production methods thereof according to the present invention will be described in further detail with reference to the drawings.

FIG. 1 is a schematic, cross-sectional view showing an example of a stacked photovoltaic element, for explaining the technical ideas of the present invention in detail. It should be noted, however, that the present invention is by no means intended to be limited to the photovoltaic element in the structure of FIG. 1. In FIG. 1, reference numeral 101 designates a substrate, 102 a back surface electrode, 103 a transparent, electroconductive layer, 104 an n-type semiconductor layer, 105 an i-type semiconductor layer comprising microcrystal silicon, 106 a p-type semiconductor layer, 107 an n-type semiconductor layer, 108 an i-type semiconductor layer comprising microcrystal SiC, 109 a p-type semiconductor layer, 110 a transparent electrode, and 111 a collector electrode. The stacked photovoltaic element of the present invention shown in FIG. 1 has the structure having two pin junctions stacked, wherein numeral 112 denotes a first pin junction, when counted from the light incidence side, the first pin junction 112 having an i-type semiconductor layer comprising SiC as a principal component, and wherein numeral 113 denotes a second pin junction, the second pin junction 113 having an i-type semiconductor layer comprising microcrystal silicon as a principal component. FIG. 1 shows the structure in which light is incident from the p-type semiconductor layer side, but, in the case of the photovoltaic element in the structure where the light is incident from the n-type semiconductor layer side, numerals 104, 107 should represent the p-type semiconductor layers and 106, 109 the n-type semiconductor layers. Further, FIG. 1 shows the structure in which the light is incident from the opposite side to the substrate, but, in the case of the photovoltaic element in the structure where the light is incident from the substrate side, the layers except for the substrate can be deposited in the reverse order to that of FIG. 1.

Figure 2:
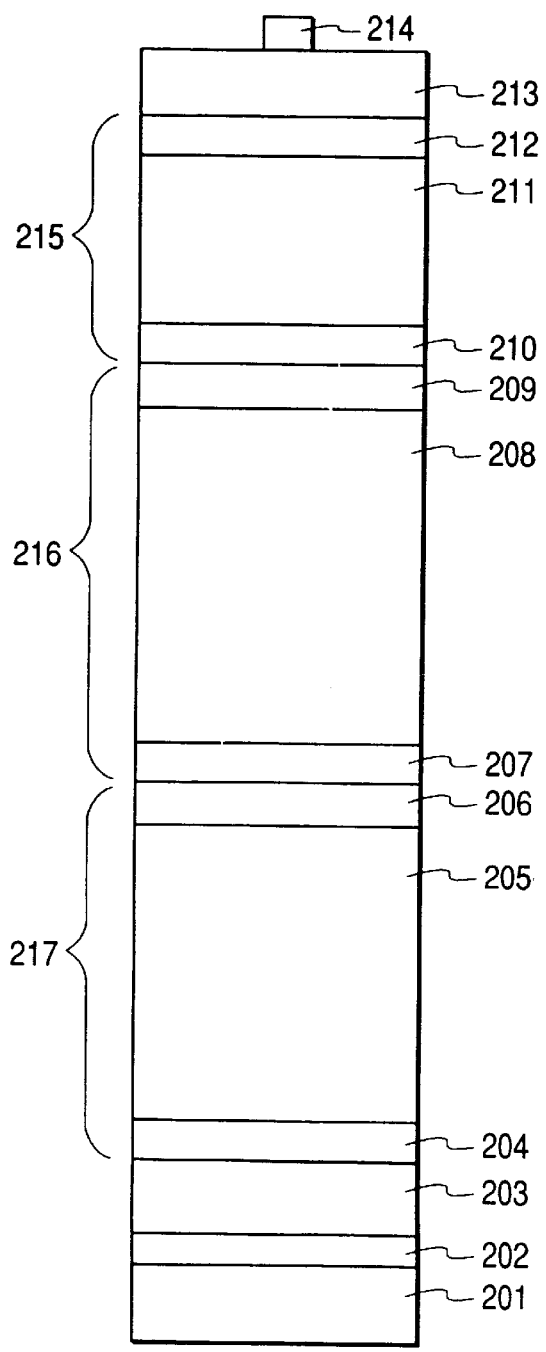
FIG. 2 is a schematic, cross-sectional view to show another example of the photovoltaic element according to the present invention.

FIG. 2 is a schematic, cross-sectional view showing another example of a stacked photovoltaic element according to the present invention. The photovoltaic element of FIG. 2 is different from that of FIG. 1 in that the photovoltaic element of FIG. 2 has the structure having three pin junctions stacked. The three pin junctions herein are a first pin junction 215, a second pin junction 216, and a third pin junction 217, when counted from the light incidence side. These three pin junctions are further stacked, after a back surface electrode 202 and a transparent, electroconductive layer 203 are formed on a substrate 201. A transparent electrode 213 and a collector electrode 214 are formed on the top of the three pin junctions, thus forming the stacked photovoltaic element. The respective pin junctions are comprised of an n-type semiconductor layer 204, 207, 210, an i-type semiconductor layer 205, 208, 211, and a p-type semiconductor layer 206, 209, 212. Here, the i-type semiconductor layer 205 contains microcrystal silicon germanium as a principal component, the i-type semiconductor layer 208 contains microcrystal silicon as a principal component, and the i-type semiconductor layer 211 contains microcrystal SiC as a principal component. It is noted that the locations of the doped layers and electrodes may be exchanged depending upon the direction of incidence of light and so on, as is the case with the photovoltaic element of FIG. 1.

Figure 3:
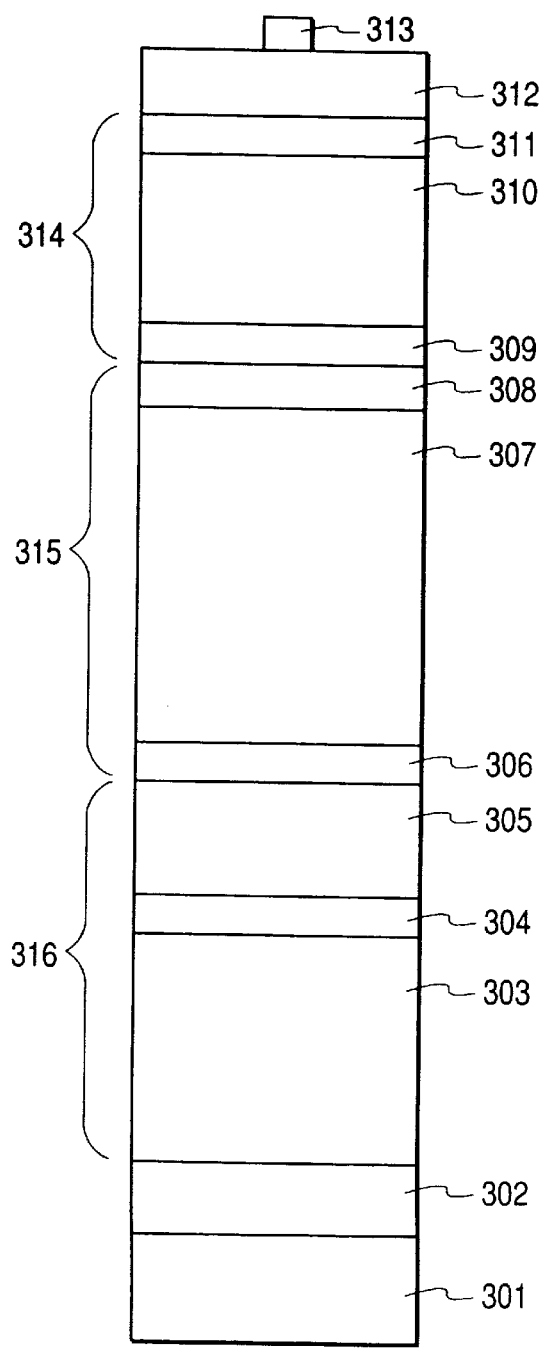
FIG. 3 is a schematic, cross-sectional view to show still another example of the photovoltaic element according to the present invention.

FIG. 3 is a schematic, cross-sectional view showing still another example of a stacked photovoltaic element according to the present invention. The photovoltaic element of FIG. 3 is different from that of FIG. 1 in that the photovoltaic element of FIG. 3 has the structure in which two pin junctions and one pn junction are stacked. Here, the two pin junctions are a first pin junction 314 and a second pin junction 315, when counted from the light incidence side. The one pn junction is a pn junction 316. These junctions are further stacked, after a back surface electrode 302 is formed on a substrate 301. A transparent electrode 312 and a collector electrode 313 are formed on the top of the three junctions, thus forming the stacked photovoltaic element. The respective junctions are composed of an n-type semiconductor layer 305, 308, 311, an i-type semiconductor layer 307, 310, a p-type semiconductor layer 303, 306, 309, and a buffer layer 304. Here, there is the characteristic feature that the n-type semiconductor layer 305 is comprised of a Group II-VI compound semiconductor, the p-type semiconductor layer 303 is comprised of a Group I-III-VI compound semiconductor, the i-type semiconductor layer 307 contains microcrystal silicon as a principal component, and the i-type semiconductor layer 310 contains microcrystal SiC as a principal component. It should be noted that the locations of the doped layers and electrodes may be exchanged depending upon the direction of incidence of light and so on, as is the case with the photovoltaic element of FIG. 1.

Each of the layers forming the photovoltaic elements according to the present invention will be described below in detail.

Semiconductor Layers

As the materials for the semiconductor layers according to the present invention, there are included those using such a Group IVA-element as Si, Ge, etc., those using such a Group IVA-alloy as SiGe, SiC, SiSn, etc., those using such a Group II-VI semiconductor as CdS, CdTe, ZnO, etc., or those using such a Group I-III-VI$_2$ semiconductor as CuInSe$_2$, Cu(InGa)Se$_2$, CuInS$_2$, etc.

Among them, in the photovoltaic elements of the present invention, the Group IVA-based non-single-crystal semiconductor materials are used particularly suitably. Specifically, there may be included microcrystal silicon (hereinafter referred to as $\mu$c-Si) such as $\mu$c-Si:H (abbreviation of hydrogenated microcrystal silicon), $\mu$c-Si:F, $\mu$c-Si:H:F, and so on; microcrystal SiC such as $\mu$c-SiC:H, $\mu$c-SiC:F, $\mu$c-SiC:H:F, and so on; microcrystal silicon germanium ($\mu$c-SiGe) such as $\mu$c-SiGe:H, $\mu$-SiGe:F, $\mu$c-SiGe:H:F, and so on; amorphous materials such as a-Si:H (abbreviation of hydrogenated amorphous silicon), a-Si:F, a-Si:H:F, a-SiGe:H, a-SiGe:F, a-SiGe:H:F, a-SiC:H, a-SiC:F, a-SiC:H:F, and so on; or mixtures of these materials.

The above semiconductor layers may undergo valence electron control and band gap control. This control can be achieved by introducing a starting compound containing an element as a valence electron controller or as a band gap controller alone or in mixture with the source gas for formation of a deposited film or with the diluent gas, into the film forming space upon formation of the semiconductor layer.

When a semiconductor layer is subject to the valence electron control, at least a part thereof is doped in the p-type and in the n-type, thereby providing at least one pin junction. Further, stacking a plurality of pin junctions can form the so-called stacked cell structure.

As the method of forming the above semiconductor layers, there may be included various CVD processes such as microwave plasma CVD, RF plasma CVD, photo-CVD, thermal CVD, and MOCVD, various evaporation processes such as EB evaporation, MBE, ion plating, and the ion beam process, sputtering, spraying, printing, and so on. Among them, in the industrial fields, there are preferably used the plasma CVD processes in which a source gas is decomposed by a plasma to effect deposition on a substrate. Further, as a reactor used in the above forming methods, there may be used batch type systems, continuous deposition systems, and so on, depending upon desired processes. In addition, a method of continuously stacking a plurality of semiconductor layers on a long substrate while carrying the substrate in the lengthwise direction thereof through a plurality of semiconductor layer forming chambers (the so called roll-to-roll method) has the effect of decreasing the production cost and the effect of enhancing the uniformity of film quality and characteristics, and is therefore used particularly suitably.

The semiconductor layers of the present invention will be described below in further detail.

(1) I-type Semiconductor Layers (intrinsic semiconductor layers)

The i-type semiconductor layers are the key feature of the photovoltaic elements of the present invention and are significant layers influencing the characteristics thereof. Particularly, the i-type semiconductor layers used in the pin junctions of the photovoltaic elements using the Group IVA or Group IVA-alloy-based non-single-crystal semiconductor materials are important layers which generate and transport carriers responding to irradiation light. As the materials for the i-type semiconductor layers required to have such a function, there are most preferably used the microcrystal materials out of the aforementioned Group IVA or Group IVA-alloy-based non-single-crystal semiconductor materials.

As the i-type semiconductor layers, there may also be used layers of a slight p-type or a slight n-type having a small amount of the valence electron controller added to facilitate transit of photocarriers. The slightly doped i-type semiconductor layers as described are also considered to be substantially intrinsic semiconductor layers.

The photovoltaic elements of the present invention are characterized in that the i-type semiconductor layers contain a microcrystal semiconductor as a principal component. The volume percentage of microcrystals in the i-type semiconductor layers is preferably not less than 30%, more preferably not less than 50%, and still more preferably not less than 70%. Further, the average grain diameter of microcrystals in the i-type semiconductor layers is preferably not less than 3 nm and not more than 50 nm, more preferably not less than 4 nm and not more than 40 nm, and still more preferably not less than 6 nm and not more than 30 nm. In addition, for the microcrystal grains in the i-type semiconductor layers, the mean diameter thereof in the vertical direction is preferably 2 or more times, more preferably 3 or more times, and still more preferably 5 or more times the mean diameter in the horizontal direction, with regard to the semiconductor-layer-formed surface.

The volume percentage of the microcrystals in the i-type semiconductor layers described above is measured by observing cross-sections by a transmission electron microscope (TEM) or by analyzing a ratio of peaks by Raman spectroscopy. Alternatively, the average grain diameter of the microcrystals in the i-type semiconductor layers is calculated from half widths of peaks by Raman spectroscopy or by x-ray diffraction.

When the i-type semiconductor layers have the microcrystals in the above-stated ranges, absorption coefficients of the ultraviolet light, visible light, and infrared light increase, the transit property of photocarriers is enhanced, and the photodeterioration of photovoltaic elements is controlled to 5% or less.

For example, when silicon is used as the semiconductor material for the i-type semiconductor layer, the band gap estimated from the graph of the absorption coefficients and photon energy is 1.0 eV, which is smaller than that of single-crystal silicon (1.1 eV). Incidentally, in the case of microcrystal SiC, there is such a tendency that the band gap is expanded as the content of hydrogen or fluorine increases or as the compositional ratio of carbon increases. However, since compositional ratios of carbon which are too high decrease the light absorption and also degrade the transit property of photocarriers, the compositional ratio x of carbon to the sum of silicon and carbon (i.e., $Si_{1-x}C_x$) is preferably not less than 0.05 and not more than 0.6, and more preferably not less than 0.1 and not more than 0.4. Further, when microcrystal SiC and microcrystal silicon coexist in the i-type semiconductor layer, their existence can be confirmed by a Raman peak at about 740 $cm^{-1}$ for microcrystal SiC and by a Raman peak at about 520 $cm^{-1}$ for microcrystal silicon.

Since in the present invention the i-type semiconductor layer containing microcrystal SiC is located closer to the light incidence side than the i-type semiconductor layer containing microcrystal silicon, it is desirable that the band gap of the i-type semiconductor layer containing microcrystal SiC be larger than that of the i-type semiconductor layer containing microcrystal silicon. Further, since the i-type semiconductor layer containing microcrystal SiGe is located on the opposite side to the light incidence side of the i-type semiconductor layer containing microcrystal silicon to absorb the light that the i-type semiconductor layer containing microcrystal silicon failed to absorb, the i-type semiconductor layer containing microcrystal SiGe desirably has a band gap smaller than that of the i-type semiconductor layer containing microcrystal silicon. The compositional ratio x of germanium in microcrystal SiGe ($Si_{1-x}Ge_x$) is preferably not less than 0.1 and not more than 0.8 and more preferably not less than 0.2 and not more than 0.7.

In the stacked photovoltaic elements, it is desired that a material with a wide band gap be used as a material for the i-type semiconductor layer in the pin junction close to the light incidence side and that a material with a narrow band gap be used as a material for the i-type semiconductor layer in the pin junction distant from the light incidence side.

In the photovoltaic elements of the present invention, another pin junction or another pn junction may be interposed between the pin junction having the i-type semiconductor layer containing microcrystal SiC and the pin junction having the i-type semiconductor layer containing microcrystal silicon, or between the pin junction having the i-type semiconductor layer containing microcrystal silicon and the pin junction having the i-type semiconductor layer containing microcrystal silicon germanium, or between the pin junction having the i-type semiconductor layer containing microcrystal silicon and the pn junction using the compound semiconductor.

The preferred thickness of the i-type semiconductor layers at least part of which is comprised of microcrystals, differs depending upon the material, the band gap, and the layer structure of the stacked cell, but, for example in the case of microcrystal silicon, the thickness is preferably not less than 0.2 $\mu$m and not more than 10 $\mu$m and more preferably not less than 0.4 $\mu$m and not more than 5 $\mu$m. In the case of materials varying the band gap depending upon the composition, such as microcrystal SiC or microcrystal SiGe, it is desired that the thickness be smaller for a small band gap and that the thickness be larger for a large band gap.

Further, when the material varying the band gap depending upon the composition is used, the photoelectric conversion efficiency of the photovoltaic element can be increased by changing the composition in the film thickness direction of the i-type semiconductor layer so as to change the band gap in the film thickness direction. In the case of the i-type semiconductor layer containing microcrystal SiC, it is desirable that the minimum of the compositional ratio of carbon exist within the half of the thickness of the i-type semiconductor layer on the p-type semiconductor layer side. Further, a desired profile is such that the compositional ratio of carbon gradually decreases from the interface (n/i interface) between the n-type semiconductor layer and the i-type semiconductor layer toward the inside of the i-type semiconductor layer, so as to decrease the band gap. In addition, it is also desirable that the compositional ratio of carbon also gradually decrease from the p/i interface toward inside the i-type semiconductor layer, so as to decrease the band gap. Moreover, in the case of the i-type semiconductor layer containing microcrystal SiGe, it is desired that the maximum of the compositional ratio of germanium exist within the half of the thickness of the i-type semiconductor layer on the p-type semiconductor layer side.

Further, by varying the average grain diameter and/or the volume percentage of microcrystals in the film with change in the compositional ratio of carbon in the i-type semiconductor layer, the photoelectric conversion efficiency of photovoltaic element can be increased.

In addition, also by varying the average grain diameter and/or the volume percentage of microcrystals in the film with change in the compositional ratio of germanium in the i-type semiconductor layer, the photoelectric conversion efficiency of photovoltaic element can also be increased.

The voids in the microcrystal semiconductor, or the grain boundaries between microcrystals, or the amorphous semiconductor contain hydrogen atoms (H, D) or halogen atoms (X), which have important roles. The roles are as follows.

The hydrogen atoms (H, D) or halogen atoms (X) contained in the i-type layer function to compensate for unbound bonds (dangling bonds) of the i-type layer, which improves the product of mobility and lifetime of carriers in the i-type layer. They also have a function to compensate for interface states of interfaces between the p-type layer and the i-type layer and between the n-type layer and the i-type layer, thus achieving the effect of enhancing the photovoltaic effect, photocurrents, and photoresponse of the photovoltaic element. The optimum content of hydrogen atoms and/or halogen atoms in the i-type layer is 0.1–40 atomic %. Particularly, in the case of the i-type semiconductor layers containing microcrystals in the present invention, a desirable content of hydrogen atoms and/or halogen atoms is 0.1–15 atomic %, and the preferred content of those decreases as the average grain diameter and volume percentage of microcrystals increase. A preferred profile of contents of hydrogen atoms and/or halogen atoms is such that more hydrogen atoms and/or halogen atoms are distributed on either interface side between the p-type layer and the i-type layer and between the n-type layer and the i-type layer. The contents of hydrogen atoms and/or halogen atoms near the interfaces are preferably in the range of 1.1 to 2 times those in the bulk. Further, it is preferred that the contents of hydrogen atoms and/or halogen atoms vary corresponding to the contents of silicon atoms.

The density of impurities, such as oxygen, carbon (except for the case of SiC), or nitrogen, in the i-type semiconductor layers should be not more than $5 \times 10^{19}/cm^3$ and preferably is as low as possible.

Further, the characteristics of the i-type semiconductor layers suitable for the photovoltaic elements of the present invention are as follows. For example, in the case of a-Si:H, those layers are preferably used in which the content of hydrogen atoms ($C_H$) is 1.0–25.0%, the photoconductivity ($\sigma p$) under irradiation with a solar simulator of AM 1.5, 100 mW/cm$^2$ is not less than $1.0 \times 10^{-6}$ S/cm, the dark conductivity ($\sigma d$) is not more than $1.0 \times 10^{-9}$ S/cm, the Urbach energy by the constant photocurrent method (CPM) is not more than 55 meV, and the localized state density is not more than $10^{17}/cm^3$.

In the case of the i-type semiconductor layer comprising $\mu c$-Si:H, preferred characteristics are as follows: the content of hydrogen atoms ($C_H$) is 0.1–15.0%, the photoconductivity ($\sigma p$) under irradiation with a solar simulator of AM 1.5, 100 mW/cm$^2$ is not less than $1.0 \times 10^{-6}$ S/cm, the dark conductivity ($\sigma d$) is not more than $1.0 \times 10^{-3}$ S/cm, the Urbach energy by the constant photocurrent method (CPM) is not more than 57 meV, and the localized state density is not more than $10^{17}/cm^3$.

(2) Methods for Forming the Semiconductor Layers

As the methods for forming the Group IVA- and Group IVA-alloy-based non-single-crystal semiconductor layers suitable for the semiconductor layers of the photovoltaic elements according to the present invention, there may be included the plasma CVD processes using AC or high frequency wave, such as RF plasma CVD, microwave plasma CVD, or the like. Among them, in the case where the i-type semiconductor layer containing microcrystals as a principal component in the present invention is formed, the microwave plasma CVD process using a high frequency not less than 0.1 GHz is particularly desirable.

The microwave plasma CVD process is a method of introducing film forming gases including a source gas, a diluent gas, or the like into a deposition chamber (vacuum chamber) which can be kept in a pressure-reduced state, keeping the internal pressure in the deposition chamber constant while evacuating the chamber by a vacuum pump, guiding a microwave oscillated by a microwave supply through a waveguide and through a dielectric window (alumina ceramic or the like) into the deposition chamber to generate a plasma of the film forming gases and decompose them, and forming a desired deposited film on a substrate placed in the deposition chamber. This method can form a deposited film applicable to photovoltaic elements under wide deposition conditions. Incidentally, when the frequency is as low as 100 MHz to 1 GHz, application from a metal electrode can be effected.

When the i-type semiconductor layer containing microcrystals as a principal component of the present invention is deposited by the microwave plasma CVD process, the preferred deposition conditions are as follows: the temperature of the substrate in the deposition chamber is 100–450° C., the internal pressure 0.5–50 mTorr, the microwave power 0.01–1 W/cm$^3$, the frequency of the microwave 0.1–10 GHz, and the deposition rate 0.05–20 nm/sec. On that occasion, the dilution rate with hydrogen is the ratio of the flow rate of hydrogen gas to the flow rate of the source gas containing constituent elements of the deposited film, and the preferred range thereof differs depending upon the type of the deposited film formed. For example, when the deposited film contains microcrystals, the hydrogen dilution rate is preferably not less than 15 times and more preferably not less than 20 times. An upper limit for the hydrogen dilution rate cannot be determined due to great differences depending upon material gases.

On the other hand, when the i-type semiconductor layer containing microcrystals as a principal component of the present invention is deposited by the RF plasma CVD process, the preferred deposition conditions are as follows: the frequency of the RF high frequency is 0.1–100 MHz, the temperature of the substrate in the deposition chamber 100–350° C., the internal pressure 0.05–5 Torr, the RF power 0.001–0.5 W/cm$^3$, and the deposition rate 0.01–3 nm/sec.

Further, when the i-type semiconductor layer containing microcrystals as a principal component of the present invention is deposited by microwave plasma CVD, it is preferable that an RF high frequency wave of 0.1–100 MHz be superimposed on the microwave plasma of 0.1–10 GHz. The microwave and RF high frequency wave may be applied from a common electrode. Particularly, it is desired that a negative self-bias voltage of preferably not more than −50 V, more preferably not more than −100 V, be applied to the high frequency electrode to which the microwave and/or the RF high frequency wave is applied. It is important therefore that the power density of the high frequency wave and the internal pressure by the film forming gases be within the aforementioned ranges and that the surface area of the high frequency electrode in the plasma be smaller than the area of the surface exposed to the plasma of the inside surface of the deposition chamber as earthed.

Further, a direct current (DC) voltage may be superimposed on the high frequency electrode to which the negative self-bias voltage is applied. It is desirable that the bias voltage of preferably not less than −500 V and not more than −100 V, more preferably not less than −400 V and not more than −150 V, be applied to the RF electrode.

Further, the substrate may be kept floating and a DC voltage may be applied thereto. It is desirable that a bias voltage of preferably not less than −30 V and not more than +30 V, more preferably not less than −20 V and not more than +20 V, be applied to the substrate.

By adjusting the above-described pressure of the film forming gases (the internal pressure), power of the high frequency, and DC voltage applied to the substrate and/or to the high frequency electrode, it is possible to control the amount of incidence of the positive ions generated by the decomposition of the film forming gases to the substrate. Since the internal pressure, the high frequency power, and the DC voltage all affect the incident amount of the positive ions to the substrate, they need to be selected taking all of the preferred conditions into consideration. For example, the incident amount of the positive ions to the substrate increases with decreasing internal pressure, with increasing high frequency power, with increasing DC voltage of the high frequency electrode, or with decreasing DC voltage of the substrate. It is thus important to control the incident amount of the positive ions by balancing the conditions in such a way that when a certain condition is so determined as to increase the incident amount of the positive ions. The other conditions are so set as to decrease the incident amount of the positive ions.

By controlling the incident amount of the positive ions to the substrate as described above, it is possible to promote the growth of microcrystals to form a high-quality microcrystal semiconductor thin film while maintaining the practical deposition rate, preventing the positive ions from damaging the surface of the deposited film.

(3) Apparatus for Forming the Semiconductor Layers

Figure 6A:
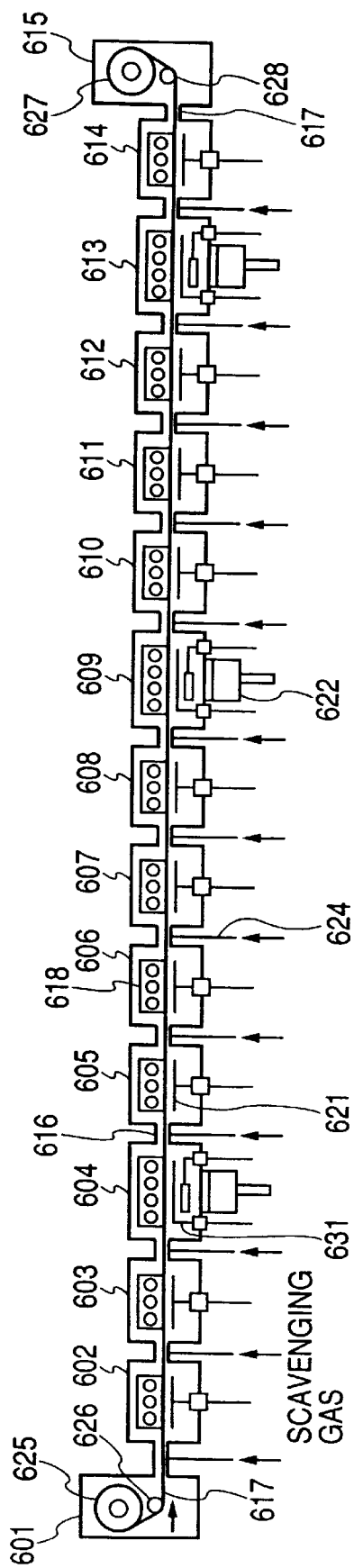
FIG. 6A and FIG. 6B are schematic views to show an example of a forming apparatus by the roll-to-roll method suitable for production of the photovoltaic element according to the present invention.
Figure 6B:
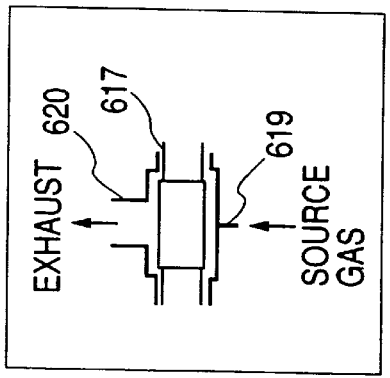

As the apparatus suitable for formation of the semiconductor layers of the photovoltaic elements according to the present invention, there are included, for example, the one shown in FIGS. 4A and 4B or the one shown in FIGS. 6A and 6B.

FIGS. 4A and 4B are schematic diagrams showing an example of the apparatus for forming the semiconductor layers of a small area photovoltaic element. The apparatus 400 of FIGS. 4A and 4B is basically composed of a plurality of connected transfer chambers 401, 402, 403, 404, 405 deposition chambers 417, 418, 419 for the semiconductor layers, disposed below the transfer chambers, heaters 410, 411, 412 for heating of a substrate, RF high frequency electrodes 420, 421, a window 425 for introduction of microwave, gas supply pipes 429, 449, 469, exhaust ports not illustrated, and an evacuation system not illustrated. In FIGS. 4A and 4B, numerals 406, 407, 408, 409 denote gate valves; 422, 423 RF power sources; 424 bias application power source; 426 a waveguide for introducing microwave; and 427 a shutter for microwave-i layer deposition.

The deposition chambers 417, 418, 419 for the semiconductor layers are separated according to the types of semiconductor layers to be deposited, wherein the n-type semiconductor layer is deposited by the RF plasma CVD process in deposition chamber 417, the i-type semiconductor layer by the microwave (MW) plasma CVD process in deposition chamber 418, and the p-type semiconductor layer by the RF plasma CVD process in deposition chamber 419, on the substrate 490 moving along rails 413 for transfer of the substrate. FIG. 4B is a schematic enlarged view of the inside of deposition chamber 418, in which the bias power of RF and/or DC can be applied from a bias electrode 428, in addition to the microwave introduced from the window 425 for introduction of microwave. When the high frequency wave of the frequency that can be introduced from a metal electrode is used, the bias electrode 428 can also be used as a high frequency electrode. In that case, the bias power of RF and/or DC can also be applied to the bias electrode 428. Further, the apparatus of FIGS. 4A and 4B is arranged so that the substrate can be kept floating and the DC voltage can be applied thereto. Application of the DC voltage to the bias electrode or to the substrate can be achieved by connecting a DC voltage power source such as a bipolar power source or a resistor resistant to high power.

FIGS. 6A and 6B show the apparatus suitable for production of the photovoltaic element of the present invention, which employs the method of continuously depositing a plurality of semiconductor layers on a long substrate while carrying the substrate in the length direction thereof through a plurality of semiconductor-layer-forming chambers (the so called roll-to-roll method). The roll-to-roll method has the effects of decreasing production cost and enhancing film thickness uniformity, film quality, and so on, and is thus particularly preferably used.

FIG. 6A is a schematic diagram of the continuous forming apparatus of the photovoltaic element using the roll-to-roll method. This apparatus is constructed in such structure that there are a substrate delivery chamber 601, a plurality of deposition chambers 602 to 614, and a substrate winding-up chamber 615, disposed in order with separation passages 616 between them, and each deposition chamber has an exhaust port to allow itself to be evacuated.

The belt-like substrate 617 passes through these deposition chambers and separation passages to be wound from the substrate delivery chamber to the substrate winding-up chamber. At the same time, a gas is introduced through a gas inlet of each deposition chamber or each separation passage and the gas is exhausted through the exhaust port of each chamber or passage, whereby each layer can be formed. Each deposition chamber is provided therein with a halogen lamp heater 618 for heating the substrate from the back, and the heater heats the substrate to a predetermined temperature in each deposition chamber.

FIG. 6B is a schematic view where a deposition chamber is seen from above. Each deposition chamber is provided with an inlet port 619 for source gas and an exhaust port 620, an RF electrode 621 or a microwave introducing part 622 is attached to the bottom of the deposition chamber, and a source gas supply system (not illustrated) is connected to the inlet port 619 for source gas. To the exhaust port of each deposition chamber is connected a vacuum exhaust pump (not illustrated) such as an oil diffusion pump, a mechanical booster pump, or the like, and the separation passage 616 connected to the deposition chamber is provided with an inlet port 624 for allowing a scavenging gas to flow into the passage.

The deposition chambers 604 and 609 for forming the i-layer (MW-i layer) by the microwave CVD process are provided with an RF bias electrode 631, to which an RF power source (not illustrated) as a power source is connected. In the substrate delivery chamber 601, there are a delivery roll 625 and a guide roller 626 for supplying adequate tension to keep the substrate horizontal, and in the substrate winding-up chamber 615 there are a winding roll 627 and a guide roller 628.

In addition to the above, as the method of forming the semiconductor layer using the Group II-VI semiconductor or the Group I-III-VI$_2$ semiconductor, there can be used the conventionally known simultaneous evaporation method, solution growth method, vapor phase seleniding method, sputtering method, CVD method, and so on, as the occasion may demand.

(4) Doped Layers

As the material for the doped layers according to the present invention [i.e., the p-type semiconductor layer (abbreviated as p-type layer) or the n-type semiconductor layer (abbreviated as n-type layer)], amorphous materials (denoted with "a-"), microcrystal materials (denoted with "$\mu$c-"), and polycrystal materials (denoted with "poly-") may be used.

As the amorphous materials for the doped layers, there may be included, for example, materials resulting from addition of a high concentration of a p-type valence electron controller (the Group III-atoms of the periodic table: B, Al, Ga, In, Tl) or an n-type valence electron controller (the Group V-atoms of the periodic table: P, As, Sb, Bi) to a-Si:H, a-Si:HX, a-SIC:H, a-SiC:HX, a-SiGe:H, a-SiGe:HX, a-SiGeC:H, a-SiGeC:HX, a-SiO:H, a-SiO:HX, a-SiN:H, a-SiN:HX, a-SiON:H, a-SiON:HX, a-SiOCN:H, a-SiOCN:HX, and so on, wherein "X" denotes a halogen element.

As the microcrystal materials for the doped layers, there may be included, for example, materials resulting from addition of a high concentration of the p-type valence electron controller (the Group III-atoms of the periodic table: B, Al, Ga, In, Tl) or the n-type valence electron controller (the Group V-atoms of the periodic table: P, As, Sb, Bi) to $\mu$c-Si:H, $\mu$c-Si:HX, $\mu$c-SiC:H, $\mu$c-SiC:HX, $\mu$c-SiO:H, $\mu$c-SiO:HX, $\mu$c-SiN:H, $\mu$c-SiN:HX, $\mu$c-SiGeC:H, $\mu$c-SiGeC:HX, $\mu$c-SiON:H, $\mu$c-SiON:HX, $\mu$c-SiOCN:H, $\mu$c-SiOCN:HX, and so on.

As the polycrystal materials for the doped layers, there may be included materials resulting from addition of a high concentration of the p-type valence electron controller (the Group III-atoms of the periodic table: B, Al, Ga, In, Tl) or the n-type valence electron controller (the Group V-atoms of the periodic table: P, As, Sb, Bi) to poly-Si:H, poly-Si:HX, poly-SiC:H, poly-SiC:HX, poly-SiO:H, poly-SiO:HX, poly-SiN:H, poly-SiN:HX, poly-SiGeC:H, poly-SiGeC:HX, poly-SiON:H, poly-SiON:HX, poly-SiOCN:H, poly-SiOCN:HX, poly-Si, poly-SiC, poly-SiO, poly-SiN, and so on.

Particularly, for the p-type layer or the n-type layer on the light incidence side, a crystalline semiconductor layer with little light absorption or a semiconductor layer with a wide band gap is suitable.

The hydrogen atoms (H, D) or halogen atoms contained in the p-type layer or in the n-type layer function to compensate for the dangling bonds in the p-type layer or in the n-type layer, thus working to increase the doping efficiency of the p-type layer or the n-type layer. The preferred amount of hydrogen atoms or halogen atoms added to the p-type layer or to the n-type layer is as described previously, but, in the case of the p-type layer or the n-type layer being crystalline, an optimum concentration of hydrogen atoms or halogen atoms is 0.1–10 atomic %.

As for the electrical characteristics of the p-type layers and the n-type layers of the photovoltaic elements, the activation energy is preferably not more than 0.2 eV and most preferably not more than 0.1 eV. The resistivity is preferably not more than 100 $\Omega$cm and most preferably not more than 1 $\Omega$cm. Further, the thickness of the p-type layers and the n-type layers is preferably 1–50 nm and more preferably 3–10 nm.

Further, as the material of the p-type layer of a compound semiconductor or the n-type layer of a compound semiconductor which forms the pn junction, there may be included, for example, Group II-VI compounds and Group I-III-VI$_2$ compounds. Specific examples include CdS, CdSe, CdTe, ZnO, ZnS, ZnSe, ZnTe, CuInSe$_2$, Cu(InGa)Se$_2$, CuInS$_2$, CuIn(Se$_{1-x}$S)$_2$, and so on. Among these, for the window layer on the light incidence side or for the buffer layer, ZnO and CdS are used particularly preferably, while for the light absorbing layer, CuInSe$_2$ and Cu(InGa)Se$_2$ are used particularly preferably. CuInSe$_2$ is sometimes abbreviated as CIS.

(5) Film Forming Gases

As the source gas suitable for deposition of the Group IVA- and Group IVA-alloy-based non-single-crystal semiconductor layers preferable for the photovoltaic elements of the present invention, there may be included gasifiable compounds containing silicon atoms, gasifiable compounds containing germanium atoms, gasifiable compounds containing carbon atoms, and so on, and gaseous mixtures of the foregoing compounds.

As the gasifiable compounds containing silicon atoms, chain or cyclic silane compounds are used, specific examples of which include gas-state compounds or readily gasifiable compounds such as SiH$_4$, Si$_2$H$_6$, SiF$_4$, SiFH$_3$, SiF$_2$H$_2$, SiF$_3$H, Si$_3$H$_8$, SiD$_4$, SiHD$_3$, SiH$_2$D$_2$, SiH$_3$D, SiFD$_3$, SiF$_2$D$_2$, Si$_2$D$_3$H$_3$, (SiF$_2$)$_5$, (SiF$_2$)$_6$, (SiF$_2$)$_4$, Si$_2$F$_6$, Si$_3$F$_8$, Si$_2$H$_2$F$_4$, Si$_2$H$_3$F$_3$, SiCl$_4$, (SiCl$_2$)$_5$, SiBr$_4$, (SiBr$_2$)$_5$, Si$_2$Cl$_6$, SiHCl$_3$, SiH$_2$Br$_2$, SiH$_2$Cl$_2$, Si$_2$Cl$_3$F$_3$, and so on.

As the gasifiable compounds containing germanium atoms, there may be included, for example, GeH$_4$, GeD$_4$, GeF$_4$, GeFH$_3$, GeF$_2$H$_2$, GeF$_3$H, GeHD$_3$, GeH$_2$D$_2$, GeH$_3$D, Ge$_2$H$_6$, Ge$_2$D$_6$, and so on.

As the gasifiable compounds containing carbon atoms, there may be included, for example, CH$_4$, CD$_4$, C$_n$H$_{2n+2}$ (n is an integer), C$_n$H$_{2n}$ (n is an integer), C$_2$H$_2$, C$_6$H$_6$, CO$_2$, CO, Si(CH$_3$)H$_3$, Si(CH$_3$)$_2$H$_2$, Si(CH$_3$)$_3$H, and so on.

Nitrogen-containing gases include, for example, N$_2$, NH$_3$, ND$_3$, NO, NO$_2$, and N$_2$O.

Oxygen-containing gases include, for example, O$_2$, CO, CO$_2$, NO, NO$_2$, N$_2$O, CH$_3$CH$_2$OH, CH$_3$OH, H$_2$O, and so on.

As the substance introduced into the p-type layer or into the n-type layer for valence electron control, Group III-atoms and Group V-atoms of the periodic table may be included.

As the starting substance for introduction of Group III-atoms, there are used, for example, for introduction of boron atoms, boron hydrides such as B$_2$H$_6$, B$_4$H$_{10}$, B$_5$H$_9$, B$_5$H$_{11}$, B$_6$H$_{10}$, B$_6$H$_{12}$, B$_6$H$_{14}$, etc., boron halides such as BF$_3$, BCl$_3$, etc., and so on. Aside from these, as the starting substance for introduction of Group III-atoms, there may be included, for example, AlCl$_3$, GaCl$_3$, InCl$_3$, TlCl$_3$, and so on. Among them, B$_2$H$_6$ and BF$_3$ are preferable.

As the starting substance for introduction of Group V-atoms, there are used, for example, for introduction of phosphorus atoms, phosphorus hydrides such as PH$_3$, P$_2$H$_4$, etc. and phosphorus halides such as PH$_4$I, PF$_3$, PF$_5$, PCl$_3$, PCl$_5$, PBr$_3$, PBr$_5$, PI$_3$, etc. Aside from these, as the starting substance for introduction of Group V-atoms, there may be included, for example, AsH$_3$, ASF$_3$, AsCl$_3$, AsBr$_3$, AsF$_5$, $SbH_3$, $SbF_3$, $SbF_5$, $SbCl_3$, $SbCl_5$, $BiH_3$, $BiCl_3$, $BiBr_3$, and so on. Among them, $PH_3$ and $PF_3$ are preferable.

These compounds may be introduced into the deposition chamber appropriately diluted with a gas such as $H_2$, He, Ne, Ar, Xe, or Kr.

Substrate

Since the semiconductor layers 104 to 109, 204 to 212, and 303 to 311 used in the photovoltaic elements according to the present invention are the thin films at most about 1 µm thick, the semiconductor layers are deposited on an appropriate substrate.

The material for such substrates 101, 201, 301 may be monocrystalline or non-monocrystalline. The electrical property of the substrate may be either electrically conductive or insulative. Further, the optical property of the substrate may be either light-transmissive or non-light-transmissive. However, a preferred substrate is one with little deformation and little distortion and with a desired strength. Specific examples of the substrate include thin plates of metals such as Fe, Ni, Cr, Al, Mo, Au, Nb, Ta, V, Ti, Pt, and Pb, or alloys thereof, for example brass, stainless steel, and so on, and composites thereof; films or sheets of heat-resistant synthetic resins such as polyester, polyethylene, polycarbonate, cellulose acetate, polypropylene, polyvinyl chloride, polyvinylidene chloride, polystyrene, polyamide, polyimide, and epoxy, composites thereof with glass fiber, carbon fiber, boron fiber, metal fiber, etc.; materials obtained by a surface coating treatment for depositing a metal thin film of a different material and/or an electrically insulative film such as $SiO_2$, $Si_3N_4$, $Al_2O_3$, AlN, or the like on the surface of these metal thin plates, resin sheets, and so on by sputtering, evaporation, plating, or the like; glasses, ceramics, and so on.

When a metal having an electrically conductive property or the like is used for the substrate, the substrate may also be used as an electrode for directly leading the electric current out. On the other hand, when the substrate is comprised of an electrically insulative synthetic resin or the like, it is desired that the electrode for leading the current out be preliminarily formed by subjecting the surface on which the deposited films are to be formed, to a surface treatment to deposit thereon, for example, a so-called metal alone or an alloy or a transparent, conductive oxide (TCO) such as Al, Ag, Pt, Au, Ni, Ti, Mo, W, Fe, V, Cr, Cu, stainless steel, brass, nichrome, $SnO_2$, $In_2O_3$, ZnO, ITO (indium tin oxide), or the like by a method such as plating, evaporation, sputtering, and so on.

It is a matter of course that even if the substrate is an electrically conductive one such as a metal, another metal layer of a different kind or the like may be provided on the side where the deposited films are formed, for the purposes of increasing the reflectance of long-wavelength light on the substrate surface, preventing mutual diffusion of constituent elements between the substrate material and the deposited film, and so on. When the substrate is relatively transparent and when the photovoltaic element is constructed in the layer structure in which the light is incident from the substrate side, it is desired that a conductive, thin film such as the aforementioned transparent, conductive oxide or the metal thin film be preliminarily deposited and formed.

The surface of the substrate may be either a so-called smooth surface or a finely uneven surface. In the case of the finely uneven surface, it is preferred that the uneven shape be spherical, conical, pyramidal, or the like and that the maximum height thereof (Rmax) be 0.05 µm to 2 µm. In this way, reflection of light at the surface thereof becomes irregular, thereby increasing optical pathlengths of the light as reflected at the surface.

The substrate can be of a plate shape, a long belt shape, a cylindrical shape, or the like having the smooth surface or the uneven surface, depending upon applications. The thickness of the substrate is properly determined so as to permit the desired photovoltaic element to be formed. When the photovoltaic element is required to have flexibility or when the light is incident from the substrate side, the thickness can be set as small as possible within the range where the function of the substrate is adequately demonstrated. However, the thickness is normally not less than 10 µm in terms of fabrication, handling and mechanical strength, and so on of the substrate.

Back Surface Electrode

The back surface electrode 102, 202, 302 used in the photovoltaic elements according to the present invention is an electrode disposed on the back surface side of the semiconductor layers with respect to the light incident direction. Accordingly, in the case of the layer structure of FIG. 1, it is located at the position of 102; conversely, in the case where the substrate 101 is transparent and where the light is incident into the semiconductor layers through the substrate, the back surface electrode is located at the position of 110. As the material for the back surface electrode, there are included, for example, metals such as gold, silver, copper, aluminum, nickel, iron, chromium, molybdenum, tungsten, titanium, cobalt, tantalum, niobium, zirconium, etc. or alloys such as stainless steel, etc. Among them, particularly preferred materials are metals with high reflectance, such as aluminum, copper, silver, gold, and so on. When a metal with high reflectance is used, the back surface electrode can also serve as a light reflecting layer for reflecting the light that the semiconductor layers failed to absorb, again toward the semiconductor layers. This back surface metallic reflecting layer may be formed by stacking two or more layers of materials of two or more kinds.

The shape of the back surface electrode may be flat, but the back surface electrode is more preferably provided with an uneven shape for scattering light. Provision of this uneven shape can scatter the long-wavelength light that was not absorbed by the semiconductor layers, so as to extend the optical pathlengths in the semiconductor layers. This results in enhancing the sensitivity of the photovoltaic element to long wavelength light to increase the short circuit current, thereby increasing the photoelectric conversion efficiency. It is desirable for the uneven shape for scattering light that the Rmax of the difference between tops and bottoms of the unevenness be from 0.2 µm to 2.0 µm. It is, however, noted that in the case where the substrate also serves as a back surface electrode, the formation of the back surface electrode might not be necessary.

The back surface electrode as described above is formed, for example, by evaporation, sputtering, plating, printing, or the like. T he uneven shape for scattering the light in the back surface electrode is formed by subjecting a film of the metal or alloy as formed to a dry etching process, a wet etching process, a sand blast process, a heat treatment or the like. It i s also possible to form the uneven shape for scattering the light by evaporating the aforementioned metal or alloy while heating the substrate.

Transparent, Conductive Layer

The transparent, conductive layer 103, 203 used in the photovoltaic elements according to the present invention is placed between the back surface metallic reflecting layer 102, 202 and the semiconductor layer 104, 204 principally for the following purposes.

(1) To enhance irregular reflection at the back surface of the photovoltaic element, confine light in the photovoltaic element by multiple interference by the thin films, extend the optical pathlengths in the semiconductor layers, and increase the short circuit current (Jsc) of the photovoltaic element.

(2) To prevent the metal of the back surface metallic reflecting layer also serving as a back surface electrode from diffusing or migrating into the semiconductor layer, thereby preventing the shunt of the photovoltaic element.

(3) Providing the transparent, conductive layer with some resistance to prevent a short from occurring between the back surface metallic reflecting layer 102, 202 and the transparent electrode 110, 213 disposed so as to sandwich the semiconductor layers due to a defect such as a pinhole of the semiconductor layers.

The transparent, conductive layer 103, 203 as described above is required to have a high transmittance in the absorbable wavelength region of the semiconductor layers and a moderate resistivity. The transmittance at the wavelengths of 650 nm or more is preferably not less than 80%, more preferably not less than 85%, and still more preferably not less than 90%. The resistivity is preferably not less than $1\times10^{-4}$ Ωcm and not more than $1\times10^6$ Ωcm, and more preferably not less than $1\times10^{-2}$ Ωcm and not more than $5\times10^4$ Ωcm.

As the materials for the transparent, conductive layer 103, 203, there are preferably used electroconductive oxides such as $In_2O_3$, $SnO_2$, ITO($In_2O_3+SnO_2$), ZnO, CdO, $Cd_2SnO_4$, $TiO_5$, $Ta_2O_5$, $Bi_2O_3$, $MoO_3$, $Na_x$, $WO_3$, etc. or mixtures thereof. These compounds may be added with an element for changing the conductivity (i.e., a dopant).

As the element for changing the conductivity (the dopant), there are preferably used, for example, Al, In, B, Ga, Si, F, etc., in the case of the transparent, conductive layer 103, 203 being ZnO; Sn, F, Te, Tl, Sb, Pb, etc., in the case of the transparent, conductive layer 103, 203 being $In_2O_3$; and F, Sb, P, As, In, Tl, Te, W, Cl, Br, I, etc., in the case of the transparent, conductive layer 103, 203 being $SnO_2$.

The method of forming the transparent, conductive layer 103, 203, includes for example, various evaporation methods such as EB evaporation and sputtering evaporation, various CVD processes, spraying methods, spin-on methods, dipping methods, and so on.

Transparent Electrode

The transparent electrode 110, 213, 312 used in the photovoltaic elements according to the present invention is the electrode on the light incidence side to transmit the light and also serves as an anti-reflection film when the thickness thereof is optimized. The transparent electrode 110, 213, 312 is required to have a high transmittance in the absorbable wavelength region of the semiconductor layers and a low resistivity. The transmittance at the wavelength of 550 nm is preferably not less than 80%, and more preferably not less than 85%. The resistivity is preferably not more than $5\times10^{-3}$ Ωcm and more preferably not more than $1\times10^{-3}$ Ωcm. As the materials for the transparent electrode 110, 213, 312, there are preferably used, for example, electrically conductive oxides such as $In_2O_3$, $SnO_2$, ITO($In_2O_3+SnO_2$), ZnO, CdO, $Cd_2SnO_4$, $TiO_2$, $Ta_2O_5$, $Bi_2O_3$, $MoO_3$, $Na_xWO_3$, etc. or mixtures thereof. These compounds may be added with an element for changing the conductivity (i.e., a dopant).

As the element for changing the conductivity (the dopant), there are preferably used, for example, Al, In, B, Ga, Si, F, etc., in the case of the transparent electrode 110, 213, 312 being ZnO; Sn, F, Te, Tl, Sb, Pb, etc., in the case of the transparent electrode 110, 213, 312 being $In_2O_3$; and F, Sb, P, As, In, Tl, Te, W, Cl, Br, I, etc., in the case of the transparent electrode 110, 213, 312 being $SnO_2$.

Further, as the method of forming the transparent electrode 110, 213, 312, there are preferably used, for example, evaporation methods, CVD processes, spraying methods, spin-on methods, dipping methods, and so on.

Collector Electrode

The collector electrode 111, 214, 313 used in the photovoltaic elements according to the present invention is formed, if necessary, in a portion on the transparent electrode 110, 213, 312 where the resistivity of the transparent electrode 110, 213, 312 is not low enough, so that the collector electrode functions to lower the resistivity of the electrode and in turn lower the series resistance of the photovoltaic element. Examples of materials for the collector electrode include metals such as gold, silver, copper, aluminum, nickel, iron, chromium, molybdenum, tungsten, titanium, cobalt, tantalum, niobium, zirconium, etc. or alloys such as stainless steel, or electrically conductive pastes using powdered metal, and so on. The collector electrode required to have the above-stated function is so shaped as to avoid interception of the incident light to the semiconductor layers as much as possible, for example, in a branch shape or in a comb shape.

The percentage of the area of the collector electrode to the total area of the photovoltaic element is preferably not more than 15%, more preferably not more than 10%, and still more preferably not more than 5%.

The formation of the pattern of the collector electrode is carried out by use of a mask, and the forming method includes, for example, evaporation, sputtering, plating, printing, and so on.

When the photovoltaic elements of the present invention are used to produce a photovoltaic device (a module or a panel) having a desired output voltage and output current, the photovoltaic elements of the present invention are connected in series or in parallel, protective layers are formed on the front and back surfaces, and output leading out electrodes or the like are attached. When the photovoltaic elements of the present invention are connected in series, a diode for the prevention of reverse bias is sometimes incorporated.

EXAMPLES

The present invention will be described in detail, using examples of the photovoltaic elements made of the non-single-crystal silicon-based semiconductor materials, but it should be noted that the present invention is by no means intended to be limited to these examples.

Example 1

($\mu$c-SiC/$\mu$c-Si)

In this example, produced using the apparatus of FIGS. 4A and 4B, was the double cell type photovoltaic element ($\mu$c-SiC/$\mu$c-Si) comprised of microcrystal SiC and microcrystal Si, shown in FIG. 1.

The photovoltaic element of the present example was made according to the fabrication steps (1) to (11) described below.

(1) Cleaning of the substrate 101

(2) Formation of the back surface electrode 102

(3) Formation of the transparent, conductive layer 103

(4) Formation of the n-type semiconductor layer 104 comprised of an n-type hydrogenated amorphous silicon layer (abbreviated as an a-n layer) and an n-type microcrystal silicon layer (abbreviated as a $\mu$c-n layer)

(5) Formation of the intrinsic semiconductor layer (abbreviated as a $\mu$c-i layer) 105 comprised of microcrystal silicon ($\mu$c-Si)

(6) Formation of the p-type microcrystal silicon layer 106

(7) Formation of the n-type semiconductor layer 107 comprised of an a-n layer and a µc-n layer (8) Formation of the i-type semiconductor layer 108 containing microcrystal SiC as a principal component (9) Formation of the p-type microcrystal SiC layer 109

(10) Formation of the transparent electrode 110

(11) Formation of the collector electrode 111

The above fabrication steps will be described below in detail.

(1) Cleaning of Substrate 101

The substrate 101 was a support made of stainless steel (SUS430BA) measuring 0.5 mm thick and 50×50 mm$^2$ in area. Before formation of the thin film, the support 101 was cleaned under ultrasonic wave in acetone and isopropanol and was dried by hot air.

(2) Formation of Back Surface Electrode 102

The back surface electrode 102 of Ag 0.3 µm thick was formed on the surface of the support 101 at room temperature, using the known DC magnetron sputtering method.

(3) Formation of Transparent, Conductive Layer 103

The transparent, conductive layer 103 comprised of ZnO 1.0 µm thick was formed at the substrate temperature of 300° C. on the back surface electrode 102 by the DC magnetron sputtering method.

(4) Formation of n-type Semiconductor Layer 104 comprised of the n-type hydrogenated amorphous silicon layer (abbreviated as an a-n layer) and the n-type microcrystal silicon layer (abbreviated as a µc-n layer)

The a-n layer 20 nm thick was formed on the transparent, conductive layer 103, using the apparatus of FIGS. 4A and 4B.

The deposition system 400 is an apparatus which is provided with entrance chamber 401 and exit chamber 405 and which is provided for stacking a plurality of semiconductor layers while carrying the substrate under reduced pressure between the plurality of film forming chambers. This apparatus is arranged to carry out both microwave plasma CVD and RF plasma CVD. Each semiconductor layer is formed on the substrate by use of this apparatus.

The cylinders of source gases not illustrated are connected through gas inlet pipes to the deposition system. All the cylinders of source gases were those including a gas purified to ultrahigh purity, and the cylinders connected were an SiH$_4$ gas cylinder, an SiH$_4$/H$_2$ (SiH$_4$ gas diluted with H$_2$ in the concentration of SiH$_4$:10%) gas cylinder, a CH$_4$ gas cylinder, a CH$_4$/H$_2$ gas cylinder (the concentration of CH$_4$: 10%), a GeH$_4$ gas cylinder, an Si$_2$H$_6$ gas cylinder, a PH$_3$/H$_2$ (the concentration of PH$_3$: 2%) gas cylinder, a BF$_3$/H$_2$ (the concentration of BF$_3$: 2%) gas cylinder, and an H$_2$ gas cylinder.

(4-1) The substrate 490 on which the layers up to the transparent, conductive layer 103 comprised of ZnO had been made was placed on rails 413 for transfer of the substrate into the entrance chamber 401, and then the entrance chamber 401 was evacuated to a pressure of not more than 1×10−5 Torr by a vacuum evacuation pump not illustrated.

(4-2) With opening of a gate valve 406, the substrate 490 was transferred into the transfer chamber 402 and deposition chamber 417 which were preliminarily evacuated by an unillustrated evacuation pump.

(4-3) The back surface of the substrate 490 was kept in close contact with the heater 410 for heating the substrate, so as to be heated, and the deposition chamber 417 was evacuated to the pressure of not more than 1×10$^{-5}$ Torr by an unillustrated evacuation pump.

The preparation for film formation was completed as described above.

Then the a-n layer was formed according to the following steps by RF plasma CVD.

(4-4-1) H$_2$ gas was introduced through the gas inlet pipe 429 into the deposition chamber 417, and the flow rate of H$_2$ gas was adjusted to 50 sccm by an unillustrated valve and an unillustrated mass flow controller. The pressure inside the deposition chamber 417 was adjusted to 1.2 Torr by an unillustrated conductance valve.

(4-4-2) The heater 410 for heating the substrate was set so that the temperature of the substrate 490 became 350° C. When the substrate temperature became stable, SiH$_4$ gas and PH$_3$/H$_2$ gas were introduced through the gas inlet pipe 429 into the deposition chamber 417 by controlling unillustrated valves. At this time, the flow rate of SiH$_4$ gas was adjusted to 2 sccm, the flow rate of H$_2$ gas to 50 sccm, and the flow rate of PH$_3$/H$_2$ gas to 0.5 sccm by mass flow controllers, and the pressure inside the deposition chamber 417 was adjusted to 1.2 Torr.

(4-5) The power of power source 422 for the RF high frequency wave (hereinafter abbreviated as "RF") of 13.56 MHz was set to 8 mW/cm$^3$, the RF power was introduced to a cup 420 for formation of plasma, which was the RF electrode, to induce a glow discharge and start formation of the a-n layer on the substrate. When the a-n layer was formed in the thickness of 20 nm, the RF power source was turned off to terminate the glow discharge and complete formation of the a-n layer. During the formation of the a-n layer the substrate was grounded and a self-bias of +13 V was applied to the RF electrode 420.

Next, the µc-n layer 15 nm thick was formed, using the same deposition system.

(4-6) The forming step of the µc-n layer was similar to that of the a-n layer, but the n-layer containing microcrystal silicon was formed under the following forming conditions: SiH$_4$/H$_2$=4 sccm, PH$_3$/H$_2$=0.5 sccm, H$_2$=100 sccm, RF power=55 mW/cm$^3$, substrate temperature=300° C., and pressure=1.0 Torr.

(4-7) After that, the flow of SiH$_4$ gas and PH$_3$/H$_2$ into the deposition chamber 417 was stopped and the flow of H$_2$ gas into the deposition chamber was continued for five minutes. Then the flow of H$_2$ was also stopped, and the inside of the deposition chamber and the gas pipe was evacuated to 1×10$^{-5}$ Torr or less.

(5) Formation of Intrinsic Semiconductor Layer (abbreviated as a µc-i layer) 105 comprised of microcrystal silicon (µc-Si)

The i-type semiconductor layer 105 comprised of µc-Si was formed in 2 µm thickness by microwave plasma CVD, according to the following procedures.

(5-1) With opening of a gate valve 407, the substrate 490 was transferred into the transfer chamber 403 and i-layer deposition chamber 418 which were preliminarily evacuated by an unillustrated evacuation pump.

(5-2) The back surface of the substrate 490 was kept in close contact with the heater 411 for heating the substrate, so as to be heated, and the i-layer deposition chamber 418 was evacuated to the pressure of not more than $1\times10^{-5}$ Torr by an unillustrated evacuation pump.

(5-3) For forming the i-layer, the heater 411 for heating the substrate was set so that the temperature of the substrate 490 became 350° C.; when the substrate was heated sufficiently, unillustrated valves were opened gradually to allow $SiH_4$ gas and $H_2$ gas to flow through the gas inlet pipe 449 into the i-layer deposition chamber 418. At this time, the flow rate of $SiH_4$ gas was adjusted to 50 sccm, and that of $H_2$ gas to 1500 sccm by respective mass flow controllers not illustrated. The pressure inside the i-layer deposition chamber 418 was adjusted to 25 mTorr by controlling the aperture of an unillustrated conductance valve.

(5-4) The microwave of 50 mW/cm³ from an unillustrated microwave power source of the frequency 2.45 GHz was introduced through the waveguide 426 for introduction of microwave and through the window 425 for introduction of microwave into the i-layer deposition chamber 418 to induce a glow discharge; and, at the same time, the RF power of 25 mW/cm³ was applied from RF power source 424 of the frequency 13.56 MHz to bias bar 428. The bias bar 428 to which the RF power was applied, was kept floating relative to the deposition chamber as grounded, and the self-bias of −220 V was applied. The substrate 490 and the heater 411 for heating the substrate in contact therewith were kept floating and the voltage of −3 V was applied thereto from the DC power source.

(5-5) With opening of a shutter 427, fabrication of the i-layer was started on the n-layer. When the i-layer was made in the thickness of 2 $\mu$m, the microwave glow discharge was stopped and the output of the RF power source 424 was turned off, thus completing fabrication of the i-layer 105.

(5-6) An unillustrated valve was closed to stop the flow of $SiH_4$ gas into the i-layer deposition chamber 418. The flow of $H_2$ gas into the i-layer deposition chamber 418 was continued for two minutes. Then an unillustrated valve was closed, and the i-layer deposition chamber 418 and the gas pipe was evacuated to $1\times10^{-5}$ Torr or less.

Incidentally, after formation of the photovoltaic element, the photovoltaic element was cut normal to the substrate and the cross-section was observed by a transmission electron microscope (TEM), with the result that the i-type semiconductor layer was microcrystal silicon, the volume percentage of microcrystals was 90%, and the average length in the vertical direction to the semiconductor-layer-formed surface was 10 times the average length in the horizontal direction as to the diameters of microcrystal grains. From measurement of x-ray diffraction, the average grain diameter of microcrystals was estimated to be 16 nm.

(6) Formation of p-type Microcrystal Silicon Layer 106

The p-layer comprised of microcrystal silicon was formed in a thickness of 10 nm according to the following procedures.

(6-1) With opening of a gate valve 408, the substrate 490 was transferred into the transfer chamber 404 and p-layer deposition chamber 419 which were preliminarily evacuated by an unillustrated evacuation pump.

(6-2) The back surface of the substrate 490 was kept in close contact with the heater 412 for heating the substrate, so as to be heated, and the p-layer deposition chamber 419 was evacuated to a pressure of not more than $1\times10^{-5}$ Torr by an unillustrated evacuation pump.

(6-3) The heater 412 for heating the substrate was set so that the temperature of the substrate 490 became 230° C.

After the substrate temperature became stable, $H_2$ gas was introduced through the gas inlet pipe 469 into the deposition chamber 419 by controlling an unillustrated valve. At this time, the flow rate of $H_2$ gas was adjusted to 80 sccm by a mass flow controller, and the pressure inside the p-layer deposition chamber 419 was controlled to 2.0 Torr by adjusting the aperture of a conductance valve not illustrated.

(6-4) The power of the RF power source 423 was set to 150 mW/cm³, and the RF power was introduced to a cup 421 for formation of plasma to induce a glow discharge. After the $H_2$ plasma process was carried on for 30 seconds, the RF power source was turned off to stop the glow discharge, thereby completing the $H_2$ plasma process.

(6-5) $H_2$ gas, $BF_3/H_2$, and $SiH_4/H_2$ gas were introduced through the gas inlet pipe 469 into the deposition chamber 419 by controlling the valves not illustrated. At this time, the flow rate of $H_2$ gas was adjusted to 40 sccm, the flow rate of $SiH_4/H_2$ gas of the 10% concentration to 0.2 sccm, and the flow rate of $BF_3/H_2$ gas of the 2% concentration to 0.5 sccm by controlling respective mass flow controllers, and the pressure inside the deposition chamber 419 was controlled to 2.0 Torr by adjusting the aperture of the conductance valve not illustrated.

(6-6) The power of the RF power source 423 was set to 150 mW/cm³, and the RF power was introduced to the cup 421 for formation of plasma to induce a glow discharge. After the $\mu$c-p layer was formed in the thickness of 10 nm, the RF power source was turned off to stop the glow discharge, thus completing formation of the $\mu$c-p layer 106. During the formation of the $\mu$c-p layer the substrate was grounded and the self-bias of +130 V was applied on the RF electrode 421.

(6-7) Then unillustrated valves were closed to stop the flow of $SiH_4/H_2$ gas and $BF_3/H_2$ gas into the p-layer deposition chamber 419. The flow of $H_2$ gas into the p-layer deposition chamber 419 was continued for three minutes. Thereafter, the flow of $H_2$ was also stopped by closing an unillustrated valve, and the p-layer deposition chamber 419 and the gas pipe was evacuated down to $1\times10^{-5}$ Torr or less.

(7) Formation of n-type Semiconductor Layer 107 comprised of the a-n layer and the $\mu$c-n layer The substrate 490 was transferred again to the deposition chamber 417, in which the n-type semiconductor layer 107 comprised of the a-n layer 15 nm thick and the $\mu$c-n layer 10 nm thick was formed according to the same procedures as in step (4). However, the substrate temperature was 300° C.

(8) Formation of i-type Semiconductor Layer 108 containing microcrystal SiC as a principal component The substrate 490 was transferred again to the deposition chamber 418, in which the i-type semiconductor layer 108 comprised of microcrystal SiC 0.8 $\mu$m thick was formed according to the same procedures as in step (5). The forming conditions at this time were as follows: $SiH_4$=37 sccm, $CH_4$=13 sccm, $H_2$=1500 sccm, pressure=20 mTorr, microwave power=80 mW/cm³, RF power=40 mW/cm³, DC voltage of substrate=−4 V, and substrate temperature=320° C. The self-bias of −290 V appeared at the bias bar 428 to which the RF power was applied.

The same measurement as in step (5) was carried out, with the result that the volume percentage of microcrystals was 80% and that the average length in the vertical direction to the semiconductor-layer-formed surface was 6 times the average length in the horizontal direction as to the diameters of microcrystal grains. From measurement of Raman spectroscopy, peaks of microcrystal SiC and microcrystal Si were observed, and it was estimated that the average grain diameter of microcrystal SiC was 7 nm and the average grain diameter of microcrystal Si was 10 nm. The compositional ratio x of carbon ($Si_{1-x}C_x$) was x=0.25 when measured by Auger electron spectroscopy (AES). The hydrogen amount ($C_H$) was $C_H$=4%, when estimated by Fourier transform infrared spectroscopy (FT-IR).

(9) Formation of p-type Microcrystal SiC Layer 109

(9-1) The substrate 490 was transferred again to the deposition chamber 419, and the $H_2$ plasma process was carried on for 30 seconds according to the same procedure as in step (6) except that the substrate temperature was 200° C. After that, the p-type microcrystal SiC layer 109 was formed in the thickness of 20 nm. The forming conditions at this time were as follows: $SiH_4/H_2$=0.25 sccm, $CH_4/H_2$=0.1 sccm, $BF_3/H_2$=0.5 sccm, $H_2$=50 sccm, pressure=1.5 Torr, RF power=170 mW/cm³, and substrate temperature=200° C.

(9-2) With opening of the gate valve 409, the substrate 490 was transferred into the exit chamber 405 which was preliminarily evacuated by an unillustrated evacuation pump, and a leak valve not illustrated was opened to allow the exit chamber 405 to leak.

(10) Formation of Transparent Electrode 110

A mask having 25 holes (having the area of 0.25 cm²) was placed on the p-type microcrystal SiC layer 109 and the transparent, conductive layer 110 was made of ITO ($In_2O_3$+$SnO_2$) in the thickness of 70 nm by the resistance heating vacuum evaporation method.

(11) Formation of Collector Electrode 111

A mask having a hole of a cross shape was placed on the transparent, conductive layer 110 and the collector electrode 111 of the cross shape was made of Cr (40 nm)/Ag (1000 nm)/Cr (40 nm) by electron beam vacuum evaporation.

The photovoltaic elements of the present example were fabricated according to steps (1) to (11) described above. The major forming conditions of the semiconductor layers are listed in Table 1 below.

TABLE 1

| Name of layer | Flow rate of gas (sccm) | | Pressure | Power | Substrate DC voltage | Substrate temperature | Thickness |
|---|---|---|---|---|---|---|---|
| a-n layer | $SiH_4$ = | 2 | 1.2 Torr | RF power 8 mW/cm³ | 0 V | 350° C. and 300° C. | 20 nm and 15 nm |
| | $H_2$ = | 50 | | | | | |
| | $PH_3/H_2$ = | 0.5 | | | | | |
| μc-n layer | $SiH_4/H_2$ = | 4 | 1.0 Torr | RF power 55 mW/cm³ | 0 V | 300° C. | 15 nm and 10 nm |
| | $H_2$ = | 100 | | | | | |
| | $PH_3/H_2$ = | 0.5 | | | | | |
| μc Si-i layer | $SiH_4/H_2$ = | 50 | 25 mTorr | microwave power 50 mW/cm³ RF power 25 mW/cm³ | −3 V | 350° C. | 2 μm |
| | $H_2$ = | 1500 | | | | | |
| μc SiC-i layer | $SiH_4/H_2$ = | 37 | 20 mTorr | microwave power 80 mW/cm³ RF power 40 mW/cm³ | −4 V | 320° C. | 0.8 μm |
| | $CH_4$ = | 13 | | | | | |
| | $H_2$ = | 1500 | | | | | |
| $H_2$ plasma process | $H_2$ = | 80 | 2.0 Torr | RF power 150 mW/cm³ | 0 V | 230° C. and 200 C. | time 30 sec |
| μc Si-p layer | $SiH_4/H_2$ = | 0.2 | 2.0 Torr | RF power 150 mW/cm³ | 0 V | 230° C. | 10 nm |
| | $H_2$ = | 40 | | | | | |
| | $BF_3/H_2$ = | 0.5 | | | | | |
| μc SiC-p layer | $SiH_4/H_2$ = | 0.25 | 1.5 Torr | RF power 170 mW/cm³ | 0 V | 200° C. | 20 nm |
| | $CH_4/H_2$ = | 0.1 | | | | | |
| | $H_2$ = | 50 | | | | | |
| | $BF_3/H_2$ = | 0.5 | | | | | |

Five photovoltaic elements were fabricated according to the above steps. Then each photovoltaic element was divided into 25 sub-cells and then the following measurements were carried out. For each evaluation, an average was calculated of 5×25 (=125) sub-cells of the photovoltaic elements.

(a) Yield of photovoltaic element

The shunt resistance was measured with the backward bias voltage of −1.0 V applied on the photovoltaic elements in a dark place. The reference value of the shunt resistance was set to $3.0 \times 10^4$ Ωcm². When a sub-cell showed a measurement result of the shunt resistance over this reference value, the sub-cell was regarded as an acceptable sub-cell. The number of accepted sub-cells was divided by 125 and the result was determined as a yield of the photovoltaic elements.

(b) Initial photoelectric conversion efficiency

The photovoltaic elements were placed under irradiation with light of AM 1.5, 100 mW/cm², using a solar simulator, and the V-I characteristics of the photovoltaic elements were measured at 25° C. Photoelectric conversion efficiencies (η) were obtained from results of this measurement, and an average was calculated for the sub-cells demonstrating the shunt resistance over the reference value, thus obtaining the initial photoelectric conversion efficiency.

(c) Characteristics after irradiation with light

A photodeterioration test was carried out for the photovoltaic elements prepared. The photovoltaic elements were irradiated with the light of AM 1.5, 100 mW/cm² by a solar simulator at a temperature of 50° C. in the open circuit state (open) for 1000 hours and thereafter the V-I characteristics were measured again under the conditions stated in (b). After the irradiation with light, measurements were carried out of the photoelectric conversion efficiency (I), the open circuit voltage (Voc), the short circuit current (Jsc), and the fill factor (FF). The photodeterioration rate was calculated based on the equation: (photodeterioration rate)=1−(photoelectric conversion efficiency after irradiation with light/initial photoelectric conversion efficiency).

(d) Durability test

The photovoltaic elements were maintained at a temperature of 85° C. and a humidity of 85% in a dark place for 100 hours with the application of a backward bias of −0.85 V (HHRB test). After that, the photoelectric conversion efficiencies were again measured under the aforementioned conditions, and the HHRB degradation rate was calculated in the same way as the photo-deterioration rate.

Comparative Example 1

(a-Si/μc-Si)

The present example is different from Example 1 in that the microcrystal SiC-i layer 108 in Example 1 was replaced by an i-layer of a-Si:H formed by the known RF plasma CVD process. The major fabrication conditions of the i-layer of a-Si:H were as follows: the substrate temperature 250° C., the deposition rate 0.15 nm/sec, and the film thickness 220 nm. In other words, stacked (a-Si/μc-Si) photovoltaic elements were fabricated which had a pin junction using a-Si:H for the i-layer thereof stacked on a pin junction using microcrystal Si for the i-layer thereof.

The other points were the same as in Example 1.

Five photovoltaic elements were fabricated as in Example 1. After that, the yield was calculated and the initial photoelectric conversion efficiency was measured at 25° C. Further, the photodeterioration test was conducted in the same way as in Example 1, measurements were carried out of the photoelectric conversion efficiency, open circuit voltage (Voc), short circuit current (Jsc), and fill factor (FF) after irradiation with light, and the photodeterioration rate was calculated. Further, the durability test was conducted in the same way as in Example 1, and the HHRB degradation rate was calculated.

Table 2 shows the measurement results of the respective characteristics in Example 1 and in Comparative Example 1

The initial photoelectric conversion efficiency and the photoelectric conversion efficiency after the irradiation with light (efficiency after light irradiation), obtained in Example 1, and the initial photoelectric conversion efficiency obtained in Comparative Example 1 are indicated by normalized values with respect to 1 for the average of efficiencies after irradiation with light, obtained in Comparative Example 1.

Further, the open circuit voltage (Voc), short circuit current (Jsc), and fill factor (FF) after irradiation with light, obtained in Example 1, are also indicated by normalized values with respect to 1 for the average of each characteristic after irradiation with light, obtained in Comparative Example 1.

TABLE 2

|  | Example 1 | Comp. Ex. 1 |
| --- | --- | --- |
| yield | 92 | 73 |
| initial efficiency | 1.18 | 1.20 |
| photodeterioration percentage (%) | 3.5 | 17 |
| efficiency after light irradiation | 1.14 | 1 |
| Voc after light irradiation | 1.00 | 1 |

TABLE 2-continued

|  | Example 1 | Comp. Ex. 1 |
| --- | --- | --- |
| Jsc after light irradiation | 1.02 | 1 |
| FF after light irradiation | 1.12 | 1 |
| HHRB deterioration percentage (%) | 4.0 | 10 |

It is seen from Table 2 that the elements of Example 1 based on the present invention demonstrated considerably decreased photodeterioration and greatly increased efficiency after irradiation with light, when compared with Comparative Example 1. This is mainly due to the increase of the fill factor (FF) after irradiation with light. In addition, the yield was greatly increased in the production of photovoltaic elements, and the HHRB degradation rate was decreased so as to enhance the durability of the photovoltaic element.

Example 2

The present example is different from Example 1 in that in the deposition of the microcrystal SiC-i layer 108, the flow rates of $SiH_4$ and $CH_4$, the RF power, and the substrate DC voltage out of the forming conditions were varied with the passage of time, whereby the compositional ratio x of carbon ($Si_{1-x}C_x$) in the microcrystal SiC-i layer was varied and whereby the grain diameter and volume percentage of microcrystal Si or microcrystal SiC were varied in the film thickness direction.

The photovoltaic elements of Example 2 were fabricated in the same manner as in Example 1, except for the above point.

The deposition conditions of the microcrystal SiC-i layer 108 were called A at the time of start of deposition, B at the time when the compositional ratio of carbon reached a minimum during deposition, and C at the end of deposition. The deposition conditions were continuously changed between the respective deposition conditions.

Figure 5A:
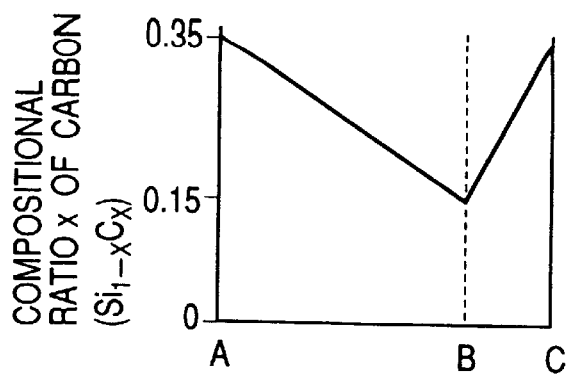
FIG. 5A, FIG. 5B, FIG. 5C, and FIG. 5D are graphs to show results of an investigation on changes in the film thickness direction of the compositional ratio of carbon, average grain diameter of microcrystals, volume percentage of microcrystals, and Raman peak intensity ratio, respectively, in the microcrystal SiC-i layer forming the photovoltaic element according to Example 2.

After fabrication of the photovoltaic elements, with sputtering the microcrystal SiC-i layer 108, component analysis was conducted by Auger electron spectroscopy (AES) to measure the profile in the depth direction. The result is shown in the graph of FIG. 5A. The total thickness of the microcrystal SiC-i layer was 0.8 μm. The thickness attained from the deposition condition A to the deposition condition B was 0.6 μm from the result of calculation of the depth based on the sputtering rate.

Figure 5B:
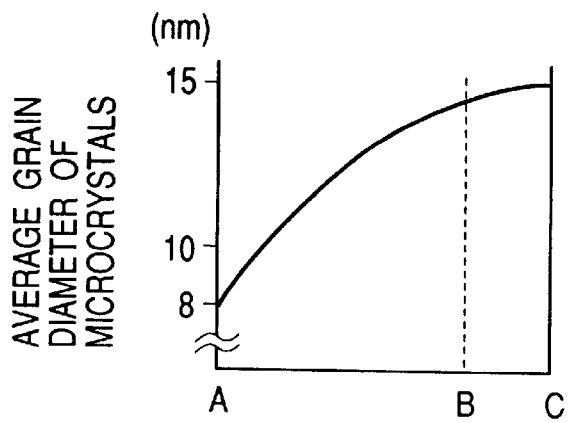
Figure 5C:
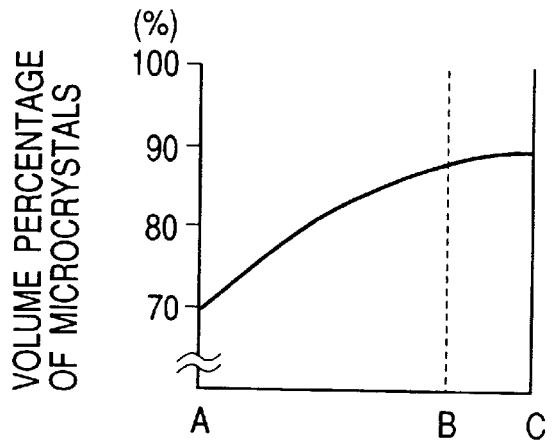

Further, when the grain diameters and volume percentages of the microcrystal SiC-i layer 108 were estimated by observing a cross-section of the film using a transmission electron microscope (TEM), they were found to be distributed in the film thickness direction as shown in FIG. 5B and FIG. 5C, respectively.

Figure 5D:
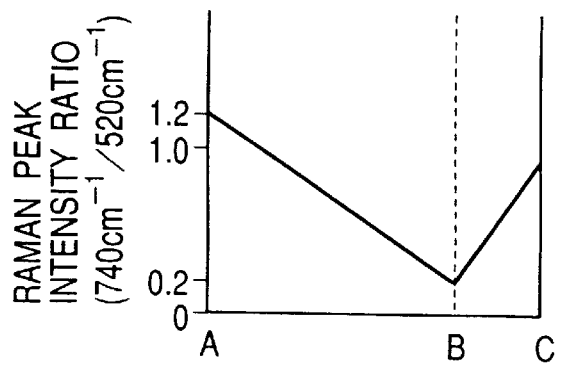

Further, samples were made by forming only the microcrystal SiC-i layer on a stainless steel substrate under the conditions of A, B, and C, and measurement by Raman spectroscopy was conducted. For these samples, the relative intensity was calculated of the Raman peak at about 740 $cm^{-1}$ to the Raman peak at about 520 $cm^{-1}$, and the graph shown in FIG. 5D was obtained. It was found from FIG. 5D that the sample under the condition of B showed a larger ratio of microcrystal Si to microcrystal SiC than the samples under the conditions of A and C.

Table 3 shows the results of the changes in the deposition conditions and the changes in the compositional ratio of carbon, the grain diameter of microcrystals, the volume percentage thereof, and the relative intensity of Raman peak.

TABLE 3

| Deposition conditions | A | B | C |
|---|---|---|---|
| SiH$_4$ (sccm) | 33 | 42 | 33 |
| CH$_4$ (sccm) | 17 | 8 | 17 |
| H$_2$ (sccm) | 1500 | 1500 | 1500 |
| pressure (mTorr) | 30 | 30 | 20 |
| microwave power (mW/cm$^3$) | 80 | 50 | 50 |
| RF power (mW/cm$^3$) | 30 | 25 | 40 |
| DC bias. (V) (bias bar) | −290 | −220 | −220 |
| substrate DC voltage (V) | −3 | −3 | −4 |
| substrate temperature (° C.) | 320 | 320 | 320 |
| thickness from n layer (μm) | 0 | 0.6 | 0.8 |
| compositional ratio x of carbon | 0.35 | 0.15 | 0.35 |
| microcrystal grain diameter (nm) | 8 | 14.5 | 15 |
| volume percentage (%) | 70 | 88 | 90 |
| Raman peak ratio (740 cm$^{-1}$/520 cm$^{-1}$) | 1.2 | 0.2 | 1.0 |

Further, FIGS. 5A to 5D are the graphs to show the changes in the compositional ratio of carbon, the average grain diameter of microcrystals, the volume percentage thereof, and the relative intensity of Raman peak among the respective conditions of A, B, and C.

The following points became apparent from Table 3 and FIGS. 5A to 5D.

(1) The changes in the compositional ratio of carbon, the average grain diameter of microcrystals, the volume percentage, and the relative intensity of Raman peak are due to the changes in the deposition conditions.

(2) From condition A to condition B, i.e., from the interface with the n-layer to the thickness at the minimum carbon compositional ratio, the average grain diameter and volume percentage increase with decrease in the compositional ratio of carbon in the microcrystal SiC-i layer.

(3) From condition B to condition C, i.e., from the thickness at the minimum carbon compositional ratio to the interface with the p-layer, the average grain diameter and volume percentage increase with increase in the compositional ratio of carbon in the microcrystal SiC-i layer.

Five photovoltaic elements were fabricated as in Example 1. After that, the yield was calculated, and the initial photoelectric conversion efficiency was measured at 25° C. Further, the photodeterioration test was conducted in the same manner as in Example 1, and measurements were carried out of the photoelectric conversion efficiency, open circuit voltage (Voc), short circuit current (Jsc), and fill factor (FF) after irradiation with light, and the photodeterioration rate was calculated. Further, the durability test was conducted in the same manner as in Example 1, and the HHRB degradation rate was calculated.

Table 4 shows the results of measurements of the respective characteristics in Example 2. As is the case with Example 1, each characteristic is indicated by a normalized value with respect to 1 for the average of a corresponding characteristic after irradiation with light, obtained in Comparative Example 1.

TABLE 4

| | Example 2 |
|---|---|
| yield | 94 |
| initial efficiency | 1.25 |
| photodeterioration percentage (%) | 3.0 |
| efficiency after light irradiation | 1.21 |

TABLE 4-continued

| | Example 2 |
|---|---|
| Voc after light irradiation | 1.03 |
| Jsc after light irradiation | 1.02 |
| FF after light irradiation | 1.15 |
| HHRB degradation percentage (%) | 4.0 |

It was verified from Table 4 that the elements of Example 2 based on the present invention demonstrated extremely decreased photodeterioration and greatly increased efficiency after irradiation with light, when compared with Comparative Example 1. This is mainly due to the increase of the open circuit voltage (Voc) and fill factor (FF) after irradiation with light. Further, the yield was greatly improved in the production of photovoltaic elements, and the HHRB degradation rate was decreased, so as to enhance the durability of the photovoltaic element. It was confirmed that better characteristics than in Example 1 were attained by changing in the film thickness direction the grain diameter and volume percentage of microcrystals with change in the compositional ratio x of carbon in the microcrystal SiC-i layer.

Example 3

In the present example, the triple type photovoltaic element was fabricated which had three pin junctions stacked as shown in FIG. 2. The photovoltaic element of the present example is characterized in that, when counted from the light incidence side, the first pin junction 215 has the i-type semiconductor layer 211 comprised of microcrystal SiC, the second pin junction 216 has the i-type semiconductor layer 208 comprised of microcrystal Si, and the third pin junction 217 has the i-type semiconductor layer 205 comprised of microcrystal SiGe.

The photovoltaic element of the present example was fabricated according to the following steps, using the forming apparatus by the roll-to-roll method shown in FIGS. 6A and 6B, which was described previously.

(1) Setting of substrate in the apparatus of FIGS. 6A and 6B

The substrate was a sheet of belt-like stainless steel (SUS430BA) measuring the length 100 m, the width 30 cm, and the thickness 0.15 mm. The SUS430BA sheet was wound around a feed bobbin (not illustrated) in a vacuum vessel (not illustrated), and RF plasma etching by Ar plasma was carried out while rotating a winding bobbin, to which one end of the sheet was connected, to feed the SUS430BA sheet.

(2) The reflective layer comprised of Al and the transparent, conductive layer comprised of ZnO were formed under the conditions shown in Table 5, by DC magnetron sputtering in the roll-to-roll method.

(3) Then the photovoltaic element was produced under the conditions shown in Table 5, using the CVD apparatus by the roll-to-roll method.

Particularly, the conditions for forming the i-layers comprised of μc-SiC, μc-Si, and μc-SiGe, which are the specific feature of the present invention, are shown in Table 6. In the present example, the positive ions incident to the substrate were controlled by superimposing the DC voltage from the bipolar DC power source on the RF bias electrode, without applying the DC bias to the substrate, and controlling the DC bias value of the RF bias electrode.

(3-1) The aforementioned SUS430BA sheet was wound around the feed roll 625 (in the average radius of curvature 30 cm), then was set in the substrate delivery chamber 601, and was allowed to pass through the respective deposition chambers. After that, the end of the substrate was rolled up on the substrate winding roll 627.

(3-2) The entire apparatus was evacuated by the evacuation pump, and the lamp heater of each deposition chamber was turned on, so that the substrate temperature in each deposition chamber was set to a predetermined temperature.

(3-3) When the pressure of the entire apparatus became 1 mTorr or less, the scavenging gas was allowed to flow through the inlet ports 619 of scavenging gas and the substrate was wound up onto the winding roll while moving in the direction of the arrow in the drawing.

(3-4) The source gases were allowed to flow into the respective deposition chambers. On this occasion, the flow rate of the scavenging gas flowing into each separation passage, or the pressure of each deposition chamber was adjusted so as to prevent the source gas flowing into each deposition chamber from diffusing into the other deposition chambers.

(3-5) Then the plasma was generated by introducing the RF power or, the microwave power and RF bias power, into each chamber and the semiconductor layers were deposited in the following procedures under the conditions shown in Table 6, thus forming the three pin junctions.

(3-5-1) First pin junction

For the first pin junction, the first n-layer 204 was formed by depositing an n11 layer comprised of a-Si in the deposition chamber 602 by RF CVD and an n12 layer comprised of $\mu$c-Si in the deposition chamber 603. Then the i1 layer 205 comprised of $\mu$c-SiGe was formed in the deposition chamber 604 by microwave CVD, and thereafter a very thin i12 layer (not illustrated) comprised of a-Si was formed in the deposition chamber 605 by RF CVD. Further, the p1 layer 206 comprised of $\mu$c-Si was formed in the deposition chamber 606.

(3-5-2) Second pin junction

For the second pin junction, the second n-layer 207 was formed by depositing an n21 layer comprised of a-Si in the deposition chamber 607 by RF CVD and an n22 layer comprised of $\mu$c-Si in the deposition chamber 608. Then the i2 layer 208 comprised of $\mu$c-Si was formed in the deposition chamber 609 by microwave CVD, and thereafter the p2 layer 209 comprised of $\mu$c-Si was formed in the deposition chamber 610.

(3-5-3) Third pin junction

For the third pin junction, the third n-layer 210 was formed by depositing an n31 layer comprised of a-Si in the deposition chamber 611 by RF CVD and an n32 layer comprised of $\mu$c-Si in the deposition chamber 612. Then the i3 layer 211 comprised of $\mu$c-SiC was formed in the deposition chamber 613 by microwave CVD, and thereafter the p3 layer 212 comprised of $\mu$-SiC was formed in the deposition chamber 614.

(3-6) When all of the substrate had been wound up, introduction of power was stopped from all microwave power sources and RF power sources to eliminate the plasma, and the flow of the source gases and scavenging gas was stopped. After a leak was effected from the substrate winding chamber 615, the winding roll was taken out.

(3-7) The transparent electrode 213 was made on the third pin junction under the conditions shown in Table 5, using a reactive sputtering system.

(3-8) A carbon paste was printed in the thickness of 5 $\mu$m and in the line width of 0.5 mm by the screen printing method, and thereafter a silver paste was printed thereon in the thickness of 10 $\mu$m and in the line width of 0.5 mm, thereby forming the collector electrode.

(3-9) The photovoltaic element of the roll shape was cut into the size of 250 mm×100 mm.

The above steps concluded the fabrication of the triple type photovoltaic element using the roll-to-roll method.

TABLE 5

| Name | No. | Material (deposition chamber) | Thickness | Principal forming conditions |
| --- | --- | --- | --- | --- |
| surface treatment of substrate | 201 | stainless steel sheet SUS430-BA | 0.15 mm | RF sputtering RF power = 300 W treatment time = 10 min substrate temp = room temp |
| back surface electrode | 202 | Al | 100 nm | substrate temp = room temp |
| transparent conductive layer | 203 | ZnO | 1.0 $\mu$m | substrate temp = 250° C. |
| n11 layer | 204 | a-Si (602) | 20 nm | |
| n12 layer | 204 | $\mu$c-Si (603) | 10 nm | |
| i1 layer | 205 | $\mu$c-SiGe (604) | 1.5 $\mu$m | |
| i12 layer | | a-Si (605) | 10 nm | |
| p1 layer | 206 | $\mu$c-Si (606) | 10 nm | |
| n21 layer | 207 | a-Si (607) | 10 nm | |
| n22 layer | 207 | $\mu$c-Si (608) | 10 nm | |
| i2 layer | 208 | $\mu$c-Si (609) | 1.7 $\mu$m | |
| p2 layer | 209 | $\mu$c-Si (610) | 10 nm | |
| n31 layer | 210 | a-Si (611) | 10 nm | |
| n32 layer | 210 | $\mu$c-Si (612) | 10 nm | |
| i3 layer | 211 | $\mu$c-SiC C613) | 0.7 $\mu$m | |
| p3 layer | 212 | $\mu$c-SiC (614) | 12 nm | |
| transparent electrode | 213 | ITO | 70 nm | |
| collector electrode | 214 | Ag paste | 10 $\mu$m | |

TABLE 6

| Deposition condition of each i layer | i1 layer 205 | i2 layer 208 | i3 layer 211 |
| --- | --- | --- | --- |
| SiH$_4$ (sccm) | 42 | 70 | 52 |
| CH$_4$ (sccm) | | | 18 |
| GeH$_4$ (sccm) | 28 | | |
| H$_2$ (sccm) | 2100 | 2100 | 2100 |

TABLE 6-continued

| Deposition condition of each i layer | i1 layer 205 | i2 layer 208 | i3 layer 211 |
|---|---|---|---|
| pressure (mTorr) | 30 | 25 | 20 |
| microwave power (mW/cm$^3$) | 45 | 50 | 80 |
| RF power (mW/cm$^3$) | 25 | 25 | 40 |
| DC bias (V) (controlled by DC power source) | −100 | −100 | −150 |
| substrate temp (° C.) | 350 | 320 | 300 |
| thickness (μm) | 15 | 1.7 | 0.7 |
| grain diameter of microcrystals (nm) | 16 | 17 | 13 |
| volume percentage (%) | 90 | 90 | 85 |

Next, in order to evaluate the characteristics of the photovoltaic element, five photovoltaic elements measuring 250 mm×100 mm were cut and selected every 20 m out of the 100 m-long photovoltaic element thus formed, and the transparent electrode of each photovoltaic element was etched to be divided into 36 sub-cells.

As with Example 1, the yield of photovoltaic elements was obtained, and the initial photoelectric conversion efficiency was measured at 25° C. Further, the photodeterioration test was conducted in the same manner as in Example 1, measurements were carried out of the photoelectric conversion efficiency, open circuit voltage (Voc), short circuit current (Jsc), and fill factor (FF) after irradiation with light, and the photodeterioration rate was calculated. The durability test was conducted in the same manner as in Example 1, and the HHRB degradation rate was calculated.

Table 7 shows the measurement results of the respective characteristics in Example 3. As is the case with Example 1, the characteristics are indicated by normalized values with respect to 1 for the average of each characteristic after irradiation with light, obtained in Comparative Example 1.

TABLE 7

| | Example 3 |
|---|---|
| yield | 96 |
| initial efficiency | 1.38 |
| photodeterioration percentage (%) | 2.0 |
| efficiency after light irradiation | 1.35 |
| Voc after light irradiation | 1.32 |
| Jsc after light irradiation | 0.90 |
| FF after light irradiation | 1.14 |
| HHRB deterioration percentage (%) | 2.5 |

It was verified from Table 7 that the elements of Example 3 based on the present invention demonstrated little photodeterioration and greatly improved efficiency after irradiation with light, as compared with Comparative Example 1. This is mainly due to the great improvement in the open circuit voltage (Voc) and fill factor (FF) after irradiation with light. The reason why Jsc after irradiation with light is slightly smaller is that the light absorption per pin junction is decreased because of the structure of the triple type photovoltaic element. It was, however, confirmed that Voc and FF were considerably increased by adopting the structure of the triple type photovoltaic element of μ-SiC/μ-Si/μ-SiGe, thus achieving better characteristics than in Example 1. It was also found that the yield was greatly increased in the production of photovoltaic elements and that the HHRB degradation rate was decreased, so as to enhance the durability of the photovoltaic element.

Example 4

Figure 7A:
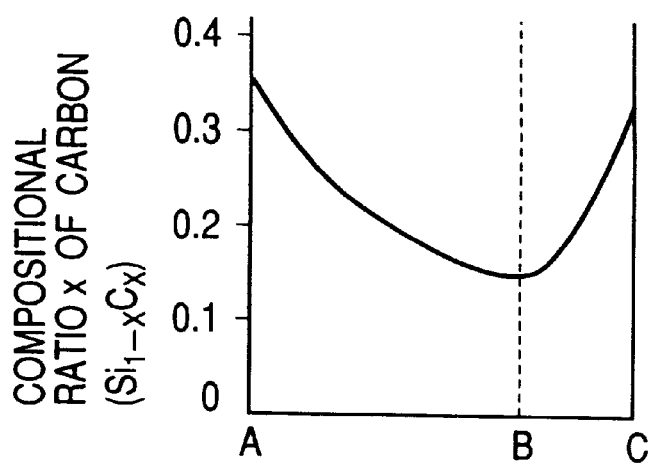
FIG. 7A, FIG. 7B, and FIG. 7C are graphs to show results of an investigation on changes in the film thickness direction of the compositional ratio of carbon, average grain diameter of microcrystals, and volume percentage of microcrystals, respectively, in the microcrystal SiC-i layer forming the photovoltaic element according to Example 4.
Figure 7B:
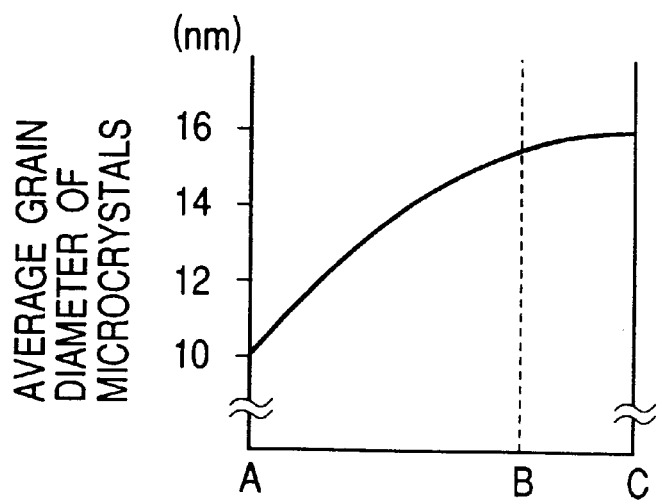
Figure 7C:
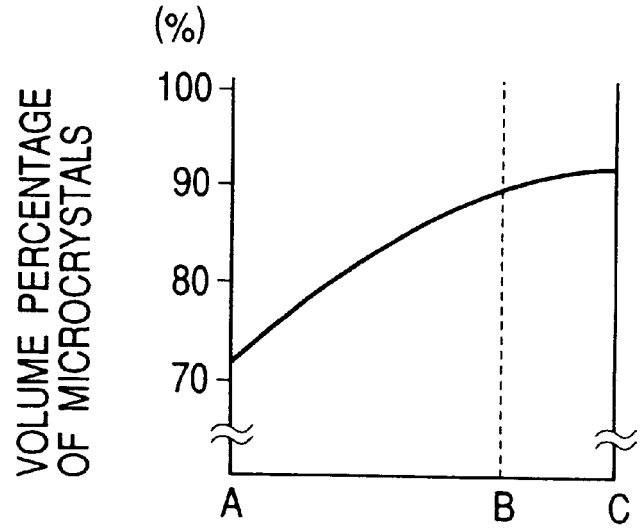

The present example is different from Example 3 in that when forming the i3 layer 211 comprised of microcrystal SiC, the compositional ratio of carbon, and the grain diameter and volume percentage of microcrystals were varied in the film thickness direction as shown in FIGS. 7A to 7C by varying the ratio of flow rates of SiH$_4$ gas and CH$_4$ gas, effective microwave power, and effective RF bias power in the transfer direction of the belt-like substrate.

In FIGS. 7A to 7C, A denotes the interface between the n-layer 210 and the i3 layer 211, B the thickness at the minimum compositional ratio of carbon, and C the interface between the i3 layer 211 and the p3 layer 212. The compositional ratios were evaluated by analysis in the depthwise direction by AES and the grain diameters and volume percentages of microcrystals by observation by x-ray diffraction and a TEM.

It was found from FIGS. 7A to 7C that from point A to point B, i.e., from the interface with the n-layer to the thickness at the minimum compositional ratio of carbon, the average grain diameter and volume percentage increased with decrease in the compositional ratio of carbon in the microcrystal SiC-i layer. It was also found that from point B to point C, i.e., from the thickness at the minimum compositional ratio of carbon to the interface with the p-layer, the average grain diameter and volume percentage increased with increase in the compositional ratio of carbon in the microcrystal SiC-i layer.

Figure 8A:
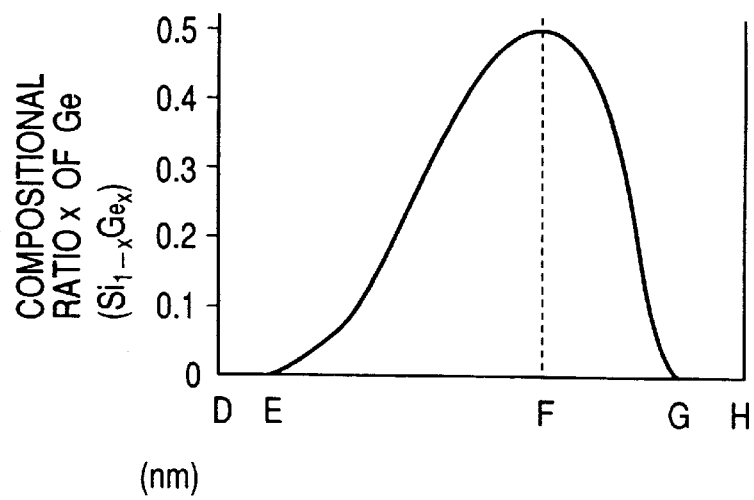
FIG. 8A, FIG. 8B, and FIG. 8C are graphs to show results of an investigation on changes in the film thickness direction of the compositional ratio of Ge, average grain diameter of microcrystals, and volume percentage of microcrystals, respectively, in the microcrystal SiGe-i layer forming the photovoltaic element according to Example 4.
Figure 8B:
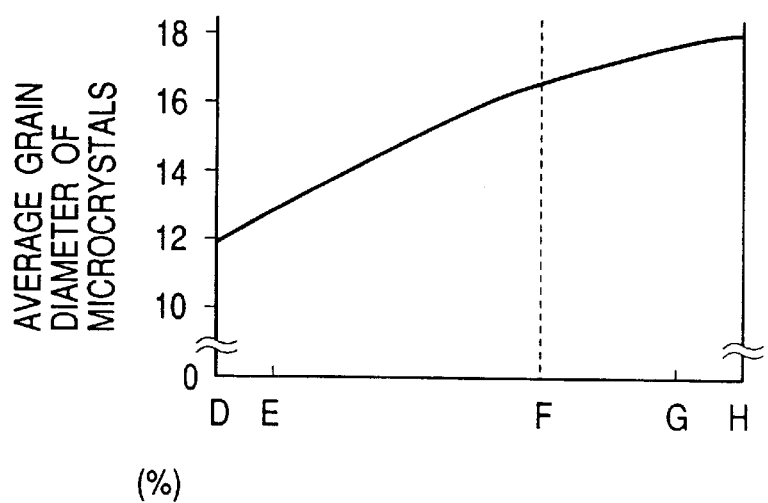
Figure 8C:
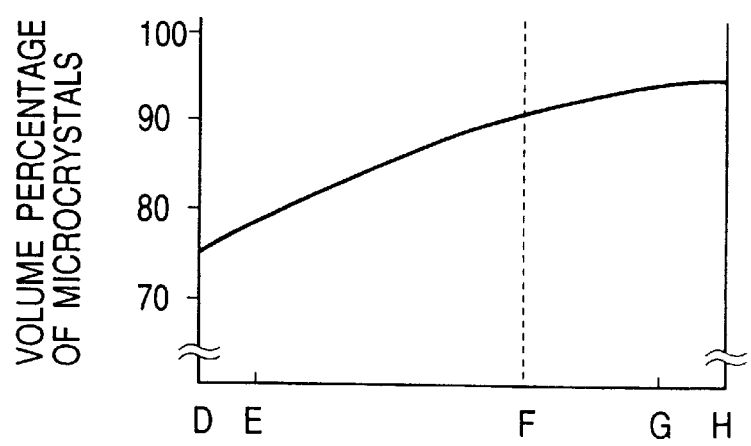

The present example is also different from Example 3 in that when forming the i1 layer 205 comprised of microcrystal SiGe, the compositional ratio of Ge, and the grain diameter and volume percentage of microcrystals were varied in the film thickness direction as shown in FIGS. 8A to 8C by varying the ratio of flow rates of SiH$_4$ gas and GeH$_4$ gas, the effective microwave power, and the effective RF bias power in the transfer direction of the belt-like substrate.

In FIGS. 8A to 8C, D denotes the interface between the n-layer 204 and the i1 layer 205, E the thickness at which Ge starts appearing in the composition, F the thickness at the maximum compositional ratio of Ge, G the thickness at which the compositional ratio of Ge again becomes 0, and H the interface between the i1 layer 205 and the i12 layer comprised of a-Si:H not illustrated. This means that in the i1 layer 205, the portion ranging from D to E near the n-layer and the portion ranging from G to H near the p-layer are comprised of microcrystal Si.

It was found from FIGS. 8A to 8C that from point E to point F, i.e., from the vicinity of the interface with the n-layer to the thickness at the maximum compositional ratio of Ge, the average grain diameter and volume percentage increased with increase in the compositional ratio of Ge in the microcrystal SiGe-i layer. It was also found that from point F to point G, i.e., from the thickness at the maximum compositional ratio of Ge to the vicinity of the interface with the p-layer, the average grain diameter and volume percentage increased with decrease in the compositional ratio of Ge in the microcrystal SiGe-i layer.

Five photovoltaic elements were selected in the same manner as in Example 3 except for the above points, and each photovoltaic element was divided into 36 sub-cells.

The yield of photovoltaic elements was obtained in the same manner as in Example 1, and the initial photoelectric conversion efficiency was measured at 25° C. Further, the photodeterioration test was conducted in the same manner as in Example 1, measurements were carried out of the photoelectric conversion efficiency, open circuit voltage (Voc), short circuit current (Jsc), and fill factor (FF) after irradiation with light, and the photodeterioration rate was calculated. The durability test was conducted in the same manner as in Example 1, and the HHRB degradation rate was calculated.

Table 8 shows the measurement results of the respective characteristics in Example 4. The characteristics are indicated by normalized values with respect to 1 for the average of each characteristic after irradiation with light, obtained in Comparative Example 1, in the same manner as in Example 1.

TABLE 8

|  | Example 4 |
| --- | --- |
| yield | 95 |
| initial efficiency | 1.44 |
| photodeterioration percentage (%) | 2.0 |
| efficiency after light irradiation | 1.41 |
| Voc after light irradiation | 1.34 |
| Jsc after light irradiation | 0.91 |
| FF after light irradiation | 1.15 |
| HHRB deterioration percentage (%) | 2.5 |

It was understood from Table 8 that the elements of Example 4 based on the present invention demonstrated little photodeterioration and greatly increased efficiency after irradiation with light, as compared with Comparative Example 1. This is mainly due to the large increase in the open circuit voltage (Voc) and fill factor (FF) after irradiation with light.

It was also confirmed that better characteristics than in Example 3 were attained by varying the compositional ratio of carbon in the i3 layer 211 comprised of microcrystal SiC, the grain diameter of microcrystals, and the volume percentage thereof as shown in FIGS. 7A to 7C and by varying the compositional ratio of Ge in the i1layer 205 comprised of microcrystal SiGe, the grain diameter of microcrystals, and the volume percentage thereof as shown in FIGS. 8A to 8C. It was also verified that the yield was greatly increased in the production of photovoltaic elements and that the HHRB degradation rate decreased, so as to enhance the durability of the photovoltaic element.

Example 5

In the present example, the triple type photovoltaic elements were fabricated which had the two pin junctions and one pn junction stacked as shown in FIG. 3. The photovoltaic elements of the present example are characterized in that, when counted from the light incidence side, the first pin junction 314 has the i-type semiconductor layer 310 comprised of microcrystal SiC, the second pin junction 315 has the i-type semiconductor layer 307 comprised of microcrystal Si, and the pn junction 316 has the p-type semiconductor layer 303 comprised of $CuInSe_2$.

The photovoltaic elements of the present example were fabricated according to the following steps.

(1) Cleaning of Substrate 301

As with Example 1, the substrate 301 employed was a support of stainless steel (SUS430BA) measuring 0.5 mm thick and 50×50 mm² in area, and this support 301 was cleaned under ultrasonic wave in acetone and isopropanol and then dried by hot air.

(2) Formation of Back Surface Electrode 302

The back surface electrode 302 comprised of molybdenum (Mo) 1 μm thick was formed on the surface of the stainless steel support 301 by the known DC magnetron sputtering method.

(3) Formation of p-type Semiconductor Layer 303

Mixed crystals of Cu, In, and Se were formed at the substrate temperature 220° C. by the known concurrent evaporation method and maintained at a substrate temperature of 500° C. in a selenium atmosphere for 60 minutes by the known vapor-phase seleniding method, thereby forming the p-type $CuInSe_2$ thin film 303 in the thickness of 2 μm.

(4) Formation of Buffer Layer 304

The CdS buffer layer 304 0.15 μm thick was formed by the known solution growth method.

(5) Formation of n-type Semiconductor Layer 305

The n-type semiconductor layer 305 comprised of ZnO doped with Al was formed in the thickness of 1 μm by the known DC magnetron sputtering method.

(6) Formation of the Semiconductor Layers

The semiconductor layers were formed in the same manner as in the step (4) and the subsequent steps of Example 1. Namely, the triple type photovoltaic elements (FIG. 3) were fabricated in the layer structure of μ-SiC/μ-Si/CIS, having the second pin junction 315 with the i-layer comprised of microcrystal Si and the first pin junction 314 with the i-layer comprised of microcrystal SiC.

At this time, the frequency of the microwave power was 500 MHz instead of 2.45 GHz, and the microwave was introduced from the metal electrode instead of the dielectric window. The thickness of the i-layer 310 comprised of microcrystal SiC was 1.0 μm, the thickness of the i-layer 307 comprised of microcrystal Si was 2.5 μm, and the thicknesses of the n-layers and the p-layers were the same as in Example 1. The n-layer and p-layer in each junction were formed in the reverse order to that in Example 1, so that the n-layer was located on the light incidence side.

Five photovoltaic elements were prepared as in Example 1, the yield thereof was obtained, and the initial photoelectric conversion efficiency was measured at 25° C. The photodeterioration test was conducted in the same manner as in Example 1, measurements were carried out of the photoelectric conversion efficiency, open circuit voltage (Voc), short circuit current (Jsc), and fill factor (FF) after irradiation with light, and the photodeterioration rate was calculated. The durability test was also conducted in the same manner as in Example 1, and the HHRB degradation rate was calculated.

Table 9 shows the measurement results of the respective characteristics in Example 5. As is the case with Example 1, the characteristics are indicated by normalized values with respect to 1 for the average of each characteristic after irradiation with light, obtained in Comparative Example 1.

TABLE 9

|  | Example 5 |
| --- | --- |
| yield | 92 |
| initial efficiency | 1.51 |
| photodeterioration percentage (%) | 1.5 |
| efficiency after light irradiation | 1.49 |

TABLE 9-continued

|  | Example 5 |
| --- | --- |
| Voc after light irradiation | 1.35 |
| Jsc after light irradiation | 1.02 |
| FF after light irradiation | 1.09 |
| HHRB degradation percentage (%) | 3.0 |

It was found from Table 9 that the elements of Example 5 based on the present invention demonstrated little photo-deterioration and greatly increased efficiency after irradiation with light, as compared with Comparative Example 1. This is mainly due to the great increase in the open circuit voltage (Voc) and fill factor (FF) after irradiation with light.

The yield was largely increased in the production of photovoltaic elements, and the HHRB degradation rate decreased, so as to enhance the durability of the photovoltaic element.

Further, better characteristics than in Example 1 were achieved by placing the pn junction using $CuInSe_2$ with large light absorption on the opposite side to the light incidence side with respect to the pin junction using the i-layer comprised of microcrystal Si because the pn junction absorbed the long-wavelength light that the pin junction using the i-layer comprised of microcrystal Si failed to absorb.

As detailed above, according to the present invention, there are provided photovoltaic elements that can be produced at low cost suitable for practical application, that demonstrate little photo-deterioration, and that also have high photoelectric conversion efficiency. Further, there can be also provided the production methods of photovoltaic elements capable of forming i-type microcrystal silicon and microcrystal SiC at a practical deposition rate.

The effects of the present invention will be detailed below.

By configuring the photovoltaic element such that the first pin junction comprising microcrystal silicon carbide as a principal component of the i-type semiconductor layer is disposed closer to the light incidence side than the second pin junction comprising microcrystal silicon as a principal component of the i-type semiconductor layer, it is possible to obtain a photovoltaic element with high initial photoelectric conversion efficiency but with a low photo-deterioration rate. In addition, it is also possible to provide a photovoltaic element with a high production yield and with excellent durability as well.

By such a configuration that the i-type semiconductor layer comprising microcrystal SiC comprises microcrystal Si as a principal component of the i-type semiconductor layer in addition to microcrystal SiC, it is possible to obtain a photovoltaic element having excellent stabilization efficiency after photodeterioration and further improved production yield and durability.

By such a configuration that the photovoltaic element has a third pin junction comprising microcrystal silicon germanium as a principal component of the i-type semiconductor layer and that the first pin junction and the third pin junction are disposed with the second pin junction therebetween, it is possible to obtain a photovoltaic element with an even higher initial photoelectric conversion efficiency.

By such a configuration that the photovoltaic element has a pn junction formed of the p-type semiconductor layer comprised of a compound semiconductor and the n-type semiconductor layer comprised of a compound semiconductor and that the first pin junction and the pn junction are disposed with the second pin junction therebetween, it is possible to obtain a photovoltaic element with an even higher initial photoelectric conversion efficiency.

By such a configuration that the compositional ratio of carbon in the i-type semiconductor layer comprising microcrystal SiC varies in the film thickness direction and that the minimum compositional ratio of carbon exists within the half of the thickness of the i-type semiconductor layer on the p-type semiconductor layer side, the photoelectric conversion efficiency of the photovoltaic element can be further increased.

By such a configuration that the average grain diameter and/or the volume percentage of the microcrystal semiconductor layer forming the i-type semiconductor layer are varied with change in the compositional ratio of carbon in the i-type semiconductor layer comprising microcrystal SiC, the photoelectric conversion efficiency can be increased in either the i-type semiconductor layer of the i-type semiconductor layer from near the n-type semiconductor layer to the vicinity of the center of the thickness of the i-type semiconductor layer or the i-type semiconductor layer near the p-type semiconductor layer.

By such a configuration that the average grain diameter of the microcrystal semiconductor in the i-type semiconductor layer comprising microcrystal SiC is not less than 3 nm and not more than 50 nm, the photoelectric conversion efficiency of the photovoltaic element can be increased and the photodeterioration rate can be decreased. In addition, the yield is also improved in the production of the photovoltaic element, and the durability of the photovoltaic element is also improved.

By such a configuration that the volume percentage of the microcrystal semiconductor in the i-type semiconductor layer comprising microcrystal SiC is not less than 30%, the photodeterioration rate is decreased, and the photovoltaic element exhibits high photoelectric conversion efficiency.

By such a configuration that the average grain diameter and/or the volume percentage of the microcrystal semiconductor forming the i-type semiconductor layer are varied with change in the compositional rate of germanium in the i-type semiconductor layer comprising microcrystal SiGe, the photoelectric conversion efficiency can be increased in either the i-type semiconductor layer of the i-type semiconductor layer from near the n-type semiconductor layer to the vicinity of the center of the thickness of the i-type semiconductor layer or the i-type semiconductor layer near the p-type semiconductor layer.

By forming the microcrystal semiconductor thin film by the steps of setting the pressure of a film forming gas introduced into a film forming space to 50 mTorr or less; using a high frequency having a frequency of not less than 0.1 GHz to generate a plasma in the film forming space, thereby decomposing the film forming gas; applying a self-bias of not more than −50 V to a high frequency electrode provided in the film forming space while applying a DC voltage to a substrate on which the microcrystal semiconductor thin film is to be deposited and/or to the high frequency electrode; and controlling an amount of incidence of positive ions generated by decomposition of the film forming gas to the substrate, it becomes possible to provide a production method of a photovoltaic element having a microcrystal semiconductor thin film, which can form the high-quality microcrystal semiconductor thin film at a practical deposition rate.

What is claimed is:
1. A method of producing a microcrystal semiconductor thin film comprising the steps of:

setting the pressure of a film forming gas introduced into a film forming space to 50 mTorr or less;

using a high frequency of not less than 0.1 GHz to generate a plasma in the film forming space, thereby decomposing the film forming gas;

applying a self-bias of not more than −50 V to a high frequency electrode provided in the film forming space while applying a DC voltage to at least one of a substrate on which the microcrystal semiconductor thin film is to be deposited and the high frequency electrode; and controlling an amount of incidence of positive ions generated by decomposition of the film forming gas to the substrate.

* * * * *

UNITED STATES PATENT AND TRADEMARK OFFICE
CERTIFICATE OF CORRECTION

PATENT NO.    : 6,383,576 B1
DATED         : May 7, 2002
INVENTOR(S)   : Jinsho Matsuyama It is certified that error appears in the above-identified patent and that said Letters Patent is hereby corrected as shown below:

Column 7,
Line 11, "photo-deterioration" should read -- photodeterioration --;
Line 21, "photo-deterioration" should read -- photodeterioration --.

Column 15,
Line 47, "405" should read -- 405, --.

Column 20,
Line 53, "T he" should read -- The --;
Line 57, "i s" should read -- is --.

Column 21,
Line 26, "$Na_{x,}$ $W0_3$," should read -- $Na_x$ $W0_3$, --

Column 28,
Table 1, "$\mu c$ SiC-i layer   $SiH_4/H_2$" should read -- $\mu c$ SiC-i  layer $SiH_4$ --.

Column 29,
Line 1, "(I)," should read -- ($\eta$), --;
Line 40, Close up right margin;
Line 42, Close up left margin.

Column 33,
Line 28, "nil" should read -- n11 --.

Column 37,
Line 32, "i1layer" should read -- i1 layer --.

UNITED STATES PATENT AND TRADEMARK OFFICE
CERTIFICATE OF CORRECTION

PATENT NO. : 6,383,576 B1
DATED : May 7, 2002
INVENTOR(S) : Jinsho Matsuyama

It is certified that error appears in the above-identified patent and that said Letters Patent is hereby corrected as shown below:

Column 39,
Line 44, "photo-deterioration" should read -- photodeterioration --.

Signed and Sealed this

First Day of April, 2003

JAMES E. ROGAN
*Director of the United States Patent and Trademark Office*